(12) United States Patent
Mao et al.

(10) Patent No.: US 9,019,587 B2
(45) Date of Patent: Apr. 28, 2015

(54) DISPLAY DEVICE PROVIDED WITH MEMS LIGHT VALVE AND FORMING METHOD THEREOF

(75) Inventors: Jianhong Mao, Shanghai (CN); Deming Tang, Shanghai (CN)

(73) Assignee: Lexvu Opto Microelectronics Technology (Shanghai) Ltd, Shanghai (CN)

( * ) Notice: Subject to any disclaimer, the term of this patent is extended or adjusted under 35 U.S.C. 154(b) by 0 days.

(21) Appl. No.: 14/112,211

(22) PCT Filed: Dec. 28, 2011

(86) PCT No.: PCT/CN2011/084787
§ 371 (c)(1),
(2), (4) Date: Nov. 20, 2013

(87) PCT Pub. No.: WO2012/142847
PCT Pub. Date: Oct. 26, 2012

(65) Prior Publication Data
US 2014/0111842 A1    Apr. 24, 2014

(30) Foreign Application Priority Data

Apr. 18, 2011  (CN) .......................... 2011 1 0097168

(51) Int. Cl.
| | |
|---|---|
| *G02B 26/00* | (2006.01) |
| *G02B 26/02* | (2006.01) |
| *G02B 26/08* | (2006.01) |
| *G09G 3/34* | (2006.01) |
| *B81C 1/00* | (2006.01) |
| *B81B 3/00* | (2006.01) |

(52) U.S. Cl.
CPC ............ *G02B 26/02* (2013.01); *G02B 26/0841* (2013.01); *G09G 3/3466* (2013.01); *B81C 1/00246* (2013.01); *G09G 2300/0426* (2013.01); *B81B 3/0021* (2013.01)

(58) Field of Classification Search
CPC ........ G02B 26/00; G02B 26/02; G02B 26/08; G02F 1/07; G09F 9/37; G09F 9/372; G09F 9/375; G09F 3/302; G09F 3/00; B81C 1/00246; B81B 3/0021
USPC ................. 359/227–236, 254, 290–292, 295; 396/235, 246, 355, 357, 449, 452–453, 396/461, 483–490, 493, 498
See application file for complete search history.

(56) References Cited

U.S. PATENT DOCUMENTS 6,288,824 B1   9/2001  Kastalsky
6,934,070 B1   8/2005  Maheshwari et al.

(Continued)

FOREIGN PATENT DOCUMENTS

| CN | 101256279 A | 9/2008 |
| CN | 102236165 A | 11/2011 |
| CN | 202057882 U | 11/2011 |

OTHER PUBLICATIONS

International Search Report (in Chinese with English Translation) and Written Opinion of the International Searching Authority (in Chinese) for PCT/CN2011/084787, mailed Mar. 22. 2012; ISA/CN.

*Primary Examiner* — Suchin Parihar
*Assistant Examiner* — William R Alexander
(74) *Attorney, Agent, or Firm* — Harness, Dickey & Pierce, P.L.C.

(57) ABSTRACT

A display device provided with an MEMS light valve, comprising: a substrate, a fixed grating located on the substrate, an MEMS light valve for controlling the opening and closing of the fixed grating; a guide is disposed on the substrate. The MEMS light valve comprises: a movable grating, a movable electrode and fixed electrodes; the moveable grating is located in the guide and is electrically connected to the guide when contacting the guide; one end of the movable electrode is fixedly connected with the movable grating, and the other end is suspended; and the fixed electrodes and the movable electrode form a capacitor. When a potential difference forms between the fixed electrodes and the movable electrode, the movable electrode drives the movable grating to move in the guide, thereby opening and closing the fixed grating. Therefore, the MEMS light valve sensitivity can be enhanced and reliability is improved.

19 Claims, 15 Drawing Sheets

(56) References Cited

U.S. PATENT DOCUMENTS

| | | |
|---|---|---|
| 7,271,945 B2 | 9/2007 | Hagood et al. |
| 7,529,017 B1 | 5/2009 | Walker et al. |
| 2006/0187530 A1* | 8/2006 | Hagood et al. ............... 359/298 |
| 2008/0062500 A1* | 3/2008 | Hagood ...................... 359/230 |
| 2009/0244678 A1 | 10/2009 | Hagood et al. |
| 2011/0032246 A1 | 2/2011 | Hong et al. |

\* cited by examiner

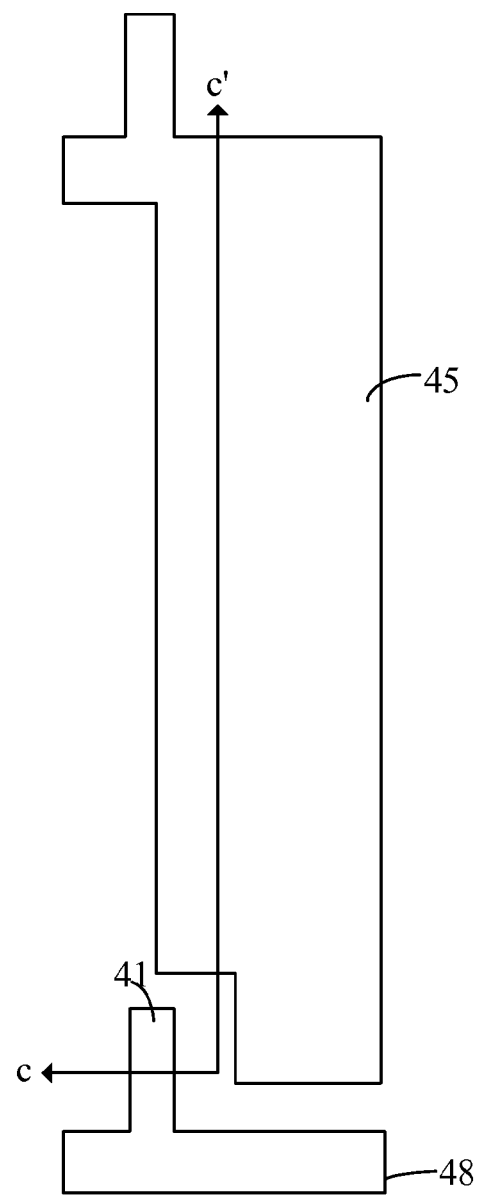
FIG. 8a₁
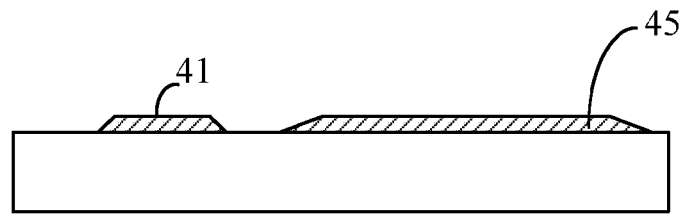
FIG. 8a₂

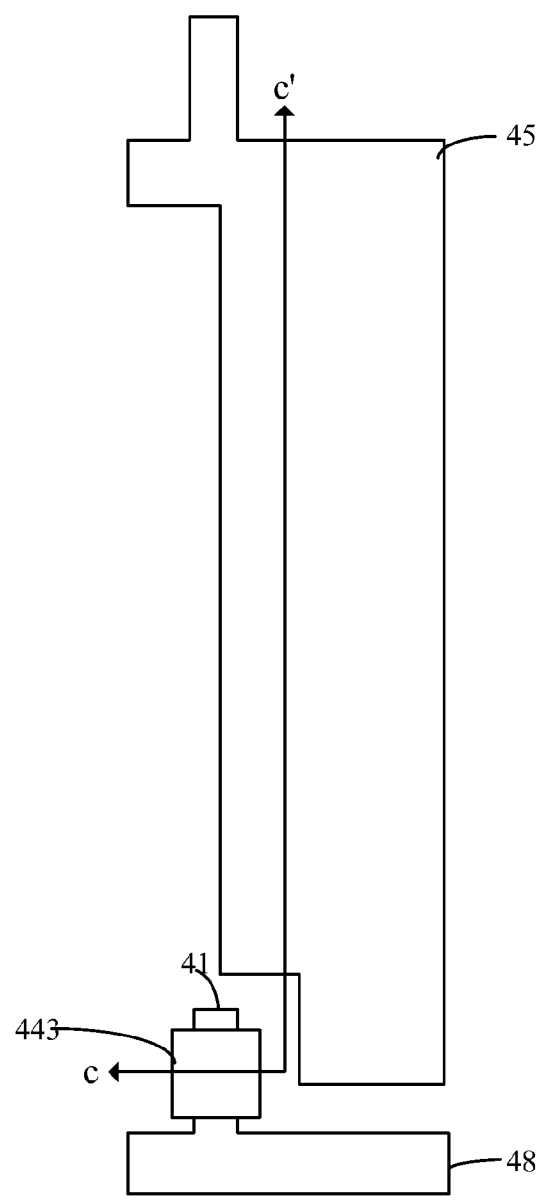
FIG. 8b₁
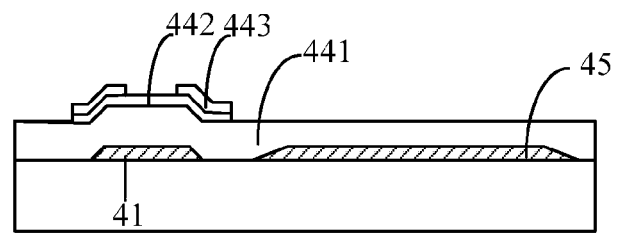
FIG. 8b₂

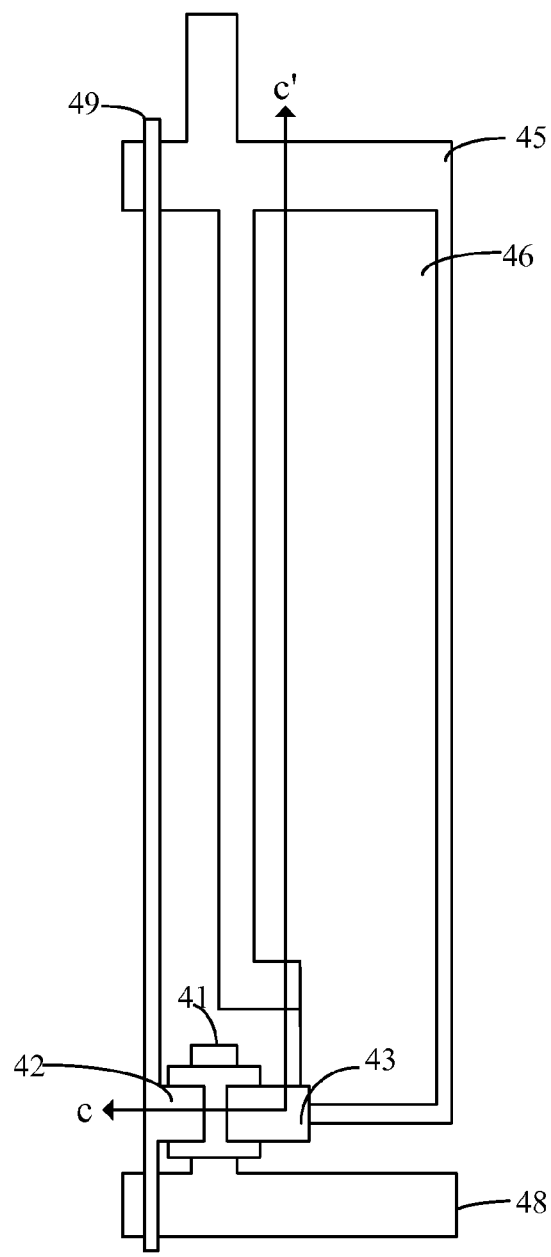
FIG. 8c$_1$
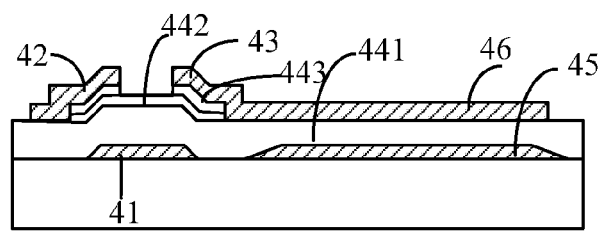
FIG. 8c$_2$

DISPLAY DEVICE PROVIDED WITH MEMS LIGHT VALVE AND FORMING METHOD THEREOF

CROSS-REFERENCE TO RELATED APPLICATIONS

This application is a Section National Stage Application of International Application No. PCT/CN2011/084787, filed Dec. 28, 2011, which claims priority to Chinese patent application No. 201110097168.5, filed on Apr. 18, 2011, and entitled "Display Device Provided with MEMS Light Valve and Forming Method thereof", the entire disclosure of which is incorporated herein by reference.

FIELD OF THE DISCLOSURE

The present disclosure generally relates to display technology, and more particularly, to a display device provided with a micro-electromechanical system (MEMS) light valve and a forming method thereof.

BACKGROUND OF THE DISCLOSURE

Recently, demands for various display devices are increasing, along with the rapid development of communication technology. There are several kinds of display devices commonly used, including: cathode-ray tube (CRT) display, liquid crystal display (LCD), plasma display panel (PDP), electro luminenscence display (ELD), vacuum fluorescence display (VFD), and the like. LCD devices, due to their characteristics like light, thin, small size, low power consumption, less radiation, and the like, are widely used in various data processing devices, such as television, laptop, mobile phone, personal data assistant, and so on.

A LCD device may mainly include following components. A substrate is provided, in which a backlight source is disposed. A pixel electrode and a thin film transistor (TFT) array are disposed on the substrate. The TFT array is electrically coupled to the pixel electrode and is used to control the electric potential of the pixel electrode. The LCD device further includes a color filter plate, and a liquid crystal layer between the pixel electrode and the color filter plate. On a surface of the color filter plate which is facing the liquid crystal layer, there is provided with a common electrode layer. Electric potential is applied to the pixel electrode through the TFT array, such that an electric potential difference exists between the common electrode layer and the pixel electrode. Liquid crystal molecules in the liquid crystal layer may deflect to certain angles depending on magnitudes of the electric potential difference. Therefore, the amount of light, which is emitted from the backlight source, passes through the liquid crystal layer and arrives at the color filter plate, can be controllable. The backlight used in the LCD device is white light. Since only polarized light can pass through the liquid crystal layer, nearly 50% of the light may be wasted. When the light is passing through the color filter plate, the upmost usage of the light may be only 33%. As a result, light usage in conventional LCD devices may be relatively low. Further, conventional LCD devices may have other drawbacks, such as narrow view angle coverage, complex construction, high cost, and the like.

Along with the development of micro-electromechanical system (MEMS) technology, MEMS light valves are tending to be used in display devices to replace liquid crystal layers. Luminousness of backlight may be controlled by using the MEMS light valves. TFT-MEMS can be integrated into current TFT-LCD panel micro manufacturing technologies. Using the MEMS, which have the advantages of high speed and high efficiency, to replace liquid crystal, there is no longer need for polaroids, color filter plates or indium tin oxide (ITO) electrodes. Therefore, light usage may be greatly increased, power consumption and manufacturing costs may be reduced.

A display device having a MEMS light valve is disclosed in U.S. Pat. No. 7,271,945B2 which is published on Sep. 18, 2007. However, the MEMS light valve has disadvantages like complex structure and low sensitivity.

SUMMARY

Embodiments in the present disclosure provide display devices having a micro-electromechanical system (MEMS) valve with improved sensitivities.

According to one embodiment, a display device with a MEMS light valve is provided, the display device includes:
a substrate, on which a bayonet is formed; and
a fixed optical grating and a MEMS light valve above the substrate, wherein the MEMS light valve is used to control the fixed optical grating to open or close,
wherein the MEMS light valve comprises:
a movable optical grating formed in the bayonet, wherein the movable optical grating is electrically coupled to the bayonet when in contact with the bayonet; and
at least one movable electrode and at least one fixed electrode, wherein the at least one movable electrode comprises one end fixed to and electrically connected with the movable optical grating and another end suspended, the at least one fixed electrode is disposed on one side or two sides of the movable electrode and constitute a capacitor with the at least one movable electrode, the movable electrode is configured to be controlled to drive the movable optical grating to move in the bayonet by controlling an electrical potential difference between the at least one fixed electrode and the movable electrode, such that the fixed optical grating is configured to be opened or closed.

Optionally, the fixed optical grating has a rectangle shape with a top side, a bottom side and two lateral sides;
wherein the movable optical grating has a rectangle shape with a first side, a second side, a third side and a fourth side, the first side is opposite to the third side, the second side is opposite to the fourth side, the first side is corresponding to the top side of the fixed optical grating, the third side is corresponding to the bottom side of the fixed optical grating, and the second side and the fourth side are respectively corresponding to the two lateral sides of the fixed optical grating; and
wherein the bayonet has a bottom fixedly mounted on the substrate, the bayonet is disposed on the first side and the third side of the movable optical grating, the first side and the third side of the movable optical grating are disposed in the bayonet, and the movable optical grating can move in the bayonet along the second side and the fourth side.

Optionally, the fixed optical grating has a rectangle shape with a top side, a bottom side and two lateral sides;
wherein the movable optical grating has a rectangle shape with a first side, a second side, a third side and a fourth side, the first side is opposite to the third side, the second side is opposite to the fourth side, the first side is corresponding to the top side of the fixed optical grating, the third side is corresponding to the bottom side of the fixed optical grating, and the second side and the fourth side are respectively corresponding to the two lateral sides of the fixed optical grating; and wherein the bayonet has a bottom fixedly mounted on the substrate, the bayonet is disposed on the first side and the third side of the movable optical grating, the first side and the third side of the movable optical grating are disposed in the bayonet, and the movable optical grating can move in the bayonet along the first side and the third side.

Optionally, the at least one fixed electrode and the at least one movable electrode are vertical with the substrate, each of which has a height to width ratio greater than about 1.5.

Optionally, the number of the movable electrodes is even and the number of the fixed electrodes is even, and the movable electrodes are symmetrically disposed on the second side and the fourth side.

Optionally, the suspended end of the at least one movable electrode is close to the at least one fixed electrode.

Optionally, the fixed optical grating is circular and includes a plurality of fan-shaped nonopaque openings, and the movable optical grating is circular and includes a plurality of fan-shaped nonopaque openings;

wherein the bayonet has a bottom fixedly mounted on the substrate, the bayonet is disposed on a peripheral edge of the movable optical grating, and the circular movable optical grating can rotate in the bayonet along a peripheral direction of the movable optical grating; and wherein the at least one movable electrode has one end fixed to and electrically connected to the peripheral edge of the movable optical grating.

Optionally, the number of the movable electrodes is even and the number of the fixed electrodes is even, and the movable electrodes are symmetrically disposed the peripheral edge of the movable optical grating.

Optionally, the fixed optical grating is fan-shaped and includes a plurality of strip-shaped nonopaque openings, and the movable optical grating is fan-shaped and includes a plurality of strip-shaped nonopaque openings;

wherein the bayonet has a bottom fixedly mounted on the substrate, the bayonet is disposed on two arc sides of the movable optical grating, and the fan-shaped movable optical grating can rotate in the bayonet along the arc sides of the movable optical grating; and wherein the at least one movable electrode has one end fixed to and electrically connected to a shorter one of the arc sides of the movable optical grating.

Optionally, each one of the fixed electrode, the movable electrode, the movable optical grating, the fixed optical grating and the bayonet includes a conductive material.

Optionally, the display device further includes a plurality of thin-film-transistor (TFT) switches on the substrate or the fixed optical grating, wherein the bayonet and the at least one fixed electrode are electrically coupled to the TFT switches, respectively.

Optionally, each of the TFT switches includes:

a gate, a source, a drain, a conductive channel for electrically coupling the source and the drain, a gate dielectric layer between the conductive channel and the gate, a source electrode electrically coupled to the source, a drain electrode electrically coupled to the drain, and a capacitor including a first plate, a second plate and a capacitor dielectric layer between the first plate and the second plate, wherein the first plate and the gate are disposed in a same layer and include a same conductive material with a luminousness less than about 50%, wherein the second plate, the source electrode and the drain electrode are in a same layer and include a same conductive material with a luminousness less than about 50%, wherein the second plate is electrically coupled to the source electrode or the drain electrode, and is electrically coupled to the fixed electrode or the bayonet.

Optionally, the conductive channel includes a lightly doped silicon layer, a heavily doped silicon layer is provided between the lightly doped silicon and the gate dielectric layer, wherein the heavily doped silicon layer includes an opening which exposes the lightly doped silicon layer, and parts the heavily doped silicon layer on two sides of the openings respectively constitute the source and the drain.

Optionally, the gate dielectric layer and the capacitor dielectric layer include a same material and are disposed in a same layer.

Optionally, each one of the first plate, the second plate, the gate, the source electrode and the drain electrode includes one material selected from metal.

Optionally, each one of the first plate, the second plate, the gate, the source electrode and the drain electrode includes at least one material selected from a group consisting of Au, Ag, Cu, Al, Ti, Cr, Mo, Cd, Ni and Co.

Optionally, each one of the first plate, the second plate, the gate, the source electrode and the drain electrode includes at least one material selected from a group consisting of Au, Ag, Cu, Al, Ti, Cr, Mo, Cd, Ni, Co, amorphous silicon, polysilicon, amorphous SiGe, and polycrystalline SiGe.

Optionally, the TFT switches are low temperature polysilicon TFT (LTPS-TFT) switches.

Optionally, the display device further includes a cap layer and a sealing cap, wherein the cap layer encompasses the MEMS light valve from lateral sides of the MEMS light valve and covers a top of the MEMS light valve, the cap layer includes at least one opening on top of the cap layer, and the sealing cap seals the at least one opening.

Optionally, each one of the cap layer and the sealing cap includes at least one material selected from a group consisting of silicon oxide, silicon nitride, silicon carbide and silicon oxynitride.

According to one embodiment, a method for forming a display device with a MEMS light valve is provided, the method includes:

providing a substrate; and forming a fixed optical grating and an above described MEMS light valve above the substrate, wherein the MEMS light valve is formed on the fixed optical grating after the fixed optical grating is formed on the substrate, or else, the fixed optical grating is formed on the MEMS light valve after the MEMS light valve is formed on the substrate.

Optionally, a plurality of thin-film-transistor (TFT) switches are formed on the substrate or the fixed optical grating before the MEMS light valve is formed, wherein the fixed electrodes are electrically coupled to the TFT switches, respectively.

Optionally, forming each one of the TFT switches includes:

forming a first conductive layer on the substrate or the fixed optical grating, wherein the first conductive layer includes a conductive material with a luminousness less than about 50%;

patterning the first conductive layer to form a gate and a first plate;

forming a first dielectric layer to cover the gate and the first plate, wherein a part of the first dielectric layer on the first plate constitutes a capacitor dielectric layer, and a part of the first dielectric layer on the gate constitutes a gate dielectric layer;

successively forming a light doped silicon layer and a heavily doped silicon layer on part of the first dielectric layer which is on the gate, wherein the heavily doped silicon layer includes an opening which exposes the lightly doped silicon layer, two parts of the heavily doped silicon layer on two sides of the opening constitute a source and a drain, respectively, and the lightly doped silicon constitutes a conductive channel;

forming a second conductive layer to cover the first dielectric layer, the lightly doped silicon layer and the heavily doped silicon layer, wherein the second conductive layer includes a conductive material with a luminousness less than about 50%; and patterning the second conductive layer to form a source electrode electrically coupled to the source, a drain electrode electrically coupled to the drain, and a second plate, wherein the second plate, the first plate and the part of the first dielectric layer on the first plate constitute a capacitor, and the second plate is electrically coupled to the source electrode or the drain electrode.

Optionally, the TFT switches are low temperature polysilicon TFT (LTPS-TFT) switches each of which is formed by:

forming a silicon layer on the substrate or the fixed optical grating;

transforming the silicon layer into a polysilicon layer;

patterning the polysilicon layer to form a patterned polysilicon layer which defines regions for a source, a drain and a channel;

forming a gate dielectric layer to cover the patterned polysilicon layer;

forming a patterned passivation layer on the gate dielectric layer;

performing ion implantation to the patterned polysilicon layer with the patterned passivation layer as a mask to form the source and the drain;

removing the patterned mask;

forming a gate on the gate dielectric layer;

forming an interlayer dielectric layer to cover the gate dielectric layer and the gate;

forming, in the gate dielectric layer and the interlayer dielectric layer, a first plug electrically coupled to the source and a second plug electrically coupled to the drain;

forming a source electrode on the first plug and a drain electrode on the second plug;

forming a patterned passivation layer on a surface constituted by the interlayer dielectric layer, the first plug and the second plug, wherein the patterned passivation layer includes an opening which exposes the source electrode or the drain electrode;

successively forming a first conductive layer, a second dielectric layer and a second conductive layer on the patterned passivation layer and the opening, wherein each one of the first conductive layer and the second conductive layer includes a material with a luminousness less than about 50%; and patterning the first conductive layer, the second dielectric layer and the second conductive layer to form a first plate, a capacitor dielectric layer and a second plate, wherein the first conductive layer is corresponding to the first plate, the second conductive layer is corresponding to the second plate, and the second dielectric layer is corresponding to the capacitor dielectric layer.

Optionally, each one of the first conductive layer and the second conductive layer includes at least one material selected from a group consisting of Au, Ag, Cu, Al, Ti, Cr, Mo, Cd, Ni, Co, amorphous silicon, polysilicon, amorphous SiGe, and polycrystalline SiGe.

Optionally, each one of the first conductive layer and the second conductive layer includes at least one material selected from a group consisting of Au, Ag, Cu, Al, Ti, Cr, Mo, Cd, Ni, Co, amorphous silicon, polysilicon, amorphous SiGe, and polycrystalline SiGe.

Optionally, the MEMS light valve and the bayonet are formed after the TFT switches are formed, and forming the MEMS light valve and the bayonet includes:

successively forming a patterned first sacrificial layer and a third conductive layer on the substrate or the fixed optical grating, wherein the patterned first sacrificial layer defines a position of the MEMS light valve;

successively etching the third conductive layer and the patterned first sacrificial layer to expose positions at which the TFT switches are electrically coupled to the at least one fixed electrode and the bayonet;

forming a patterned second sacrificial layer on the etched third conductive layer and the etched patterned first sacrificial layer to define a position of the bayonet;

successively forming a fourth conductive layer and a third dielectric layer to cover the patterned second sacrificial layer and the etched third conductive layer;

patterning the fourth conductive layer and the third dielectric layer to form the bayonet and the at least one fixed electrode of the MEMS light valve;

patterning the etched third conductive layer to form the movable optical grating and the at least one movable electrode of the MEMS light valve; and removing the patterned first sacrificial layer and the patterned second sacrificial layer.

Optionally, the method further includes:

before removing the patterned first sacrificial layer and the patterned second sacrificial layer, forming a third sacrificial layer to cover the MEMS light valve, the bayonet and the patterned first sacrificial layer; and forming a cap layer on the third sacrificial layer, wherein the cap layer includes a plurality of openings to expose the third sacrificial layer, the cap layer encompasses the MEMS light valve from lateral sides of the MEMS light valve and covers a top of the MEMS light valve.

Optionally, the third sacrificial layer is removed together with the first sacrificial layer and the second sacrificial layer, and removing the first, second and third sacrificial layers includes:

ionizing oxygen to form oxygen plasma; and inletting the oxygen plasma into the openings to ash the amorphous carbon at a temperature ranging from about 150° C. to about 450° C.

Optionally, the first, second and third sacrificial layers include amorphous carbon.

Optionally, the method further includes: after the first, second and third sacrificial layers are removed, forming a sealing cap to cover the cap layer.

Optionally, the method further includes: after the third sacrificial layer is formed and before the cap layer is formed, patterning the third sacrificial layer to form an isolating groove among neighboring MEMS light valves, wherein the cap layer is formed on a surface of the patterned third sacrificial layer.

Optionally, each one of the cap layer and the sealing cap includes a material selected from a group consisting of silicon oxide, silicon nitride, silicon carbide and silicon oxynitride, and is formed using chemical vapor deposition.

Compared with conventional techniques, embodiments of the present disclosure have following advantageous.

At least one end of the movable electrode of the MEMS light valve provided according to embodiments of the present disclosure is suspended, so that the MEMS light valve may be sensitive to electrostatic forces. When there are electric potential differences between the movable electrode and the fixed electrode, the movable electrode may be sensitive to electrostatic forces applied from the fixed electrodes. Therefore, sensitivity of the MEMS light valve may be improved, and further improving reliability of the display device.

In some embodiments, the display device further includes the cap layer and the sealing cap which can perform a sealing function to prevent steam, dust, impurities and the like from entering into the display device, thereby increasing the service life of the display device.

Besides, in some embodiments, the TFT switch has the first plate, the second electrode and the capacitor dielectric layer therebetween constituting its capacitor. The first plate and the gate are in the same layer and have the same material which is a conductive material with a luminousness less than about 50%. The second plate, the source and the drain are in the same layer and have the same material which is a conductive material with a luminousness less than about 50%. When the MEMS light valve is used in the display device, since the MEMS light valve doesn't need a relatively large opening rate, the TFT switch can be disposed in the display device at a position which is not used to let light through. Further, the first plate, the second plate, the gate, the source and the drain all have a conductive material with a luminousness less than about 50%, so that the TFT switch can be better compatible with the MEMS light valve, which may improve the device performance. During formation of a TFT switch with such structure, the first plate and the gate can be formed in the same step, the second plate, the drain and the source can be formed in the same step, and the capacitor dielectric layer can be formed in the same step with the gate dielectric layer. Therefore, manufacturing process of the TFT switch may be simplified. There is no need to form the capacitor separately with the transistor. Costs may be reduced, production may be accelerated, and efficiency may be increased.

Figure 22:
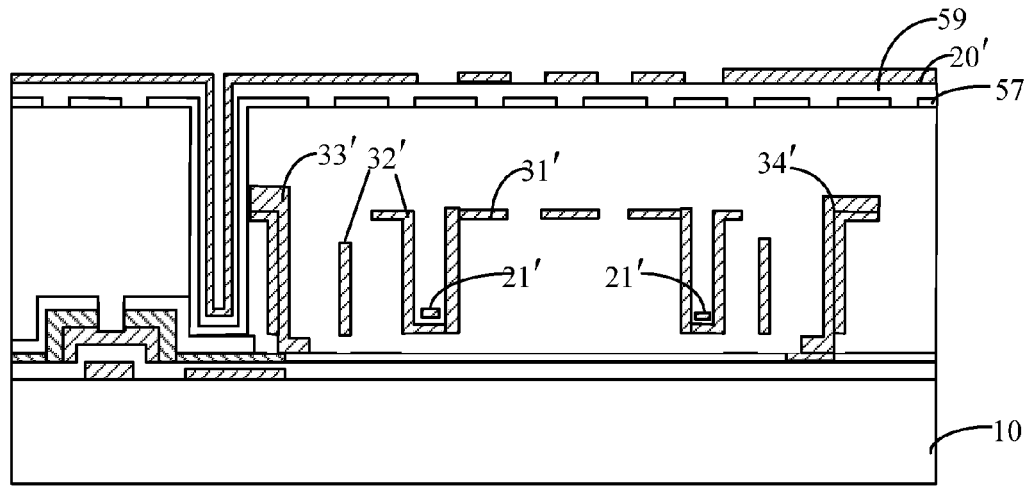
Figure 23:
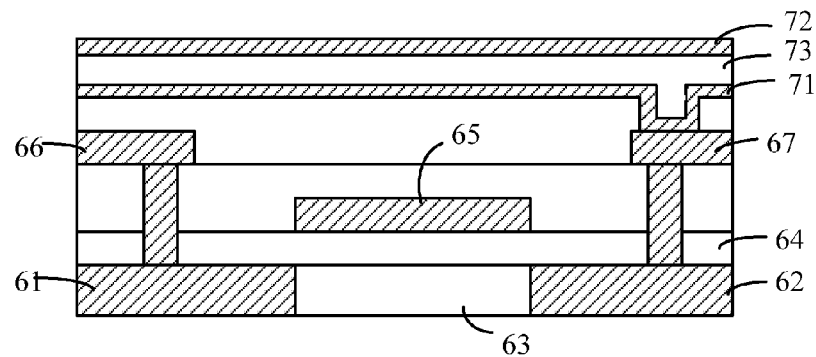
Figure 24:
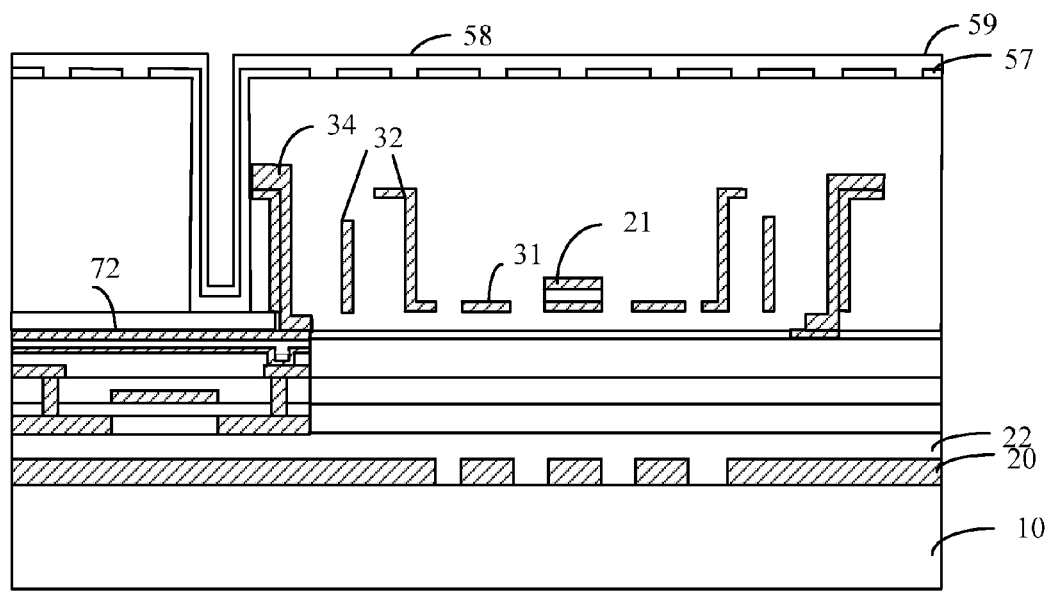

FIGS. $8a_1$, $8a_2$ to $8d$ schematically illustrate cross-sectional views of intermediate structures formed in a process for forming a TFT switch according to one embodiment of the present disclosure;

FIG. 22 schematically illustrates a cross-sectional view of a display device with a MEMS light valve according to one embodiment of the present disclosure;

FIG. 23 schematically illustrates a cross-sectional view of a LTPS-TFT switch according to one embodiment of the present disclosure; and FIG. 24 schematically illustrates applying a LTPS-TFT switch in a display device according to one embodiment of the present disclosure.

DETAILED DESCRIPTION OF THE DISCLOSURE

In order to make those skilled in the art better under the present disclosure, display devices of the present disclosure will be illustrated in detail with reference to specific embodiments hereinafter.

Figure 1A:
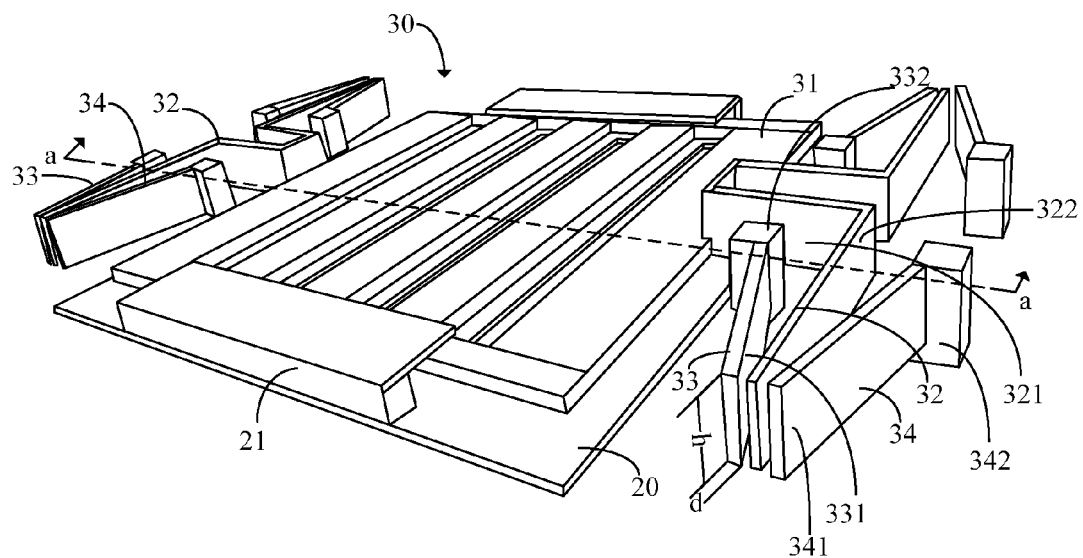
FIG. 1a schematically illustrates a three dimensional view of a fixed optical grating and a micro-electromechanical system (MEMS) light valve in a display device according to one embodiment of the present disclosure.
Figure 1B:
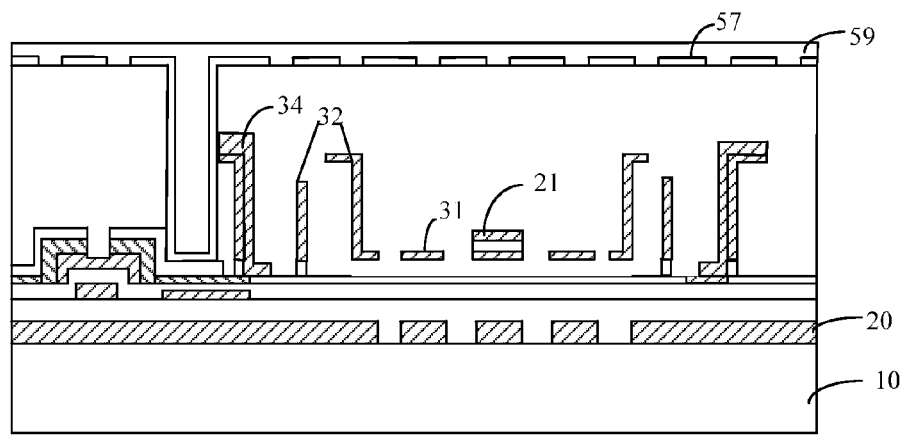
FIG. 1b schematically illustrates a cross-sectional view along a-a direction illustrated in FIG. 1a of a display device with a MEMS light valve according to one embodiment of the present disclosure.

FIG. 1a schematically illustrates a three dimensional view of a fixed optical grating and a micro-electromechanical system (MEMS) valve in a display device according to one embodiment of the present disclosure. FIG. 1b schematically illustrates the display device along a-a direction as shown in FIG. 1a. Referring to FIGS. 1a and 1b, the display device provided in one embodiment of the present disclosure may include: a substrate 10, a fixed optical grating 20 and a MEMS light valve 30 on the substrate 10. The MEMS light valve 30 is used to open and close the fixed optical grating 20, i.e., the MEMS light valve 30 may control the fixed optical grating 20 to be opaque or nonopaque. At least one bayonet 21 is disposed on the substrate 10. The MEMS light valve 30 includes a movable optical grating 31, at least one set of electrodes including a movable electrode 32, a fixed electrode 33 and a fixed electrode 34. The movable optical grating 31 is partially accommodated by the bayonet 21 and can be electrically coupled to the bayonet 21 when both are in contact with each other. That is to say, when the movable optical grating 31 is in contact with the bayonet 21, they are electrically coupled with each other. One end of the movable electrode 32 is fixed on and electrically connected with the movable optical grating 31, while another end of the movable electrode 32 is suspended. The fixed electrodes 33, 34 together with the movable electrode 32 may constitute a capacitor. The fixed electrodes 33 and 34 may be disposed on one side of the movable electrode 32, or respectively on two sides of the movable electrode 32. By adjusting electric potential differences between the fixed electrodes 33, 34 and the movable electrode 32, the movable electrode 32 may be controlled to carry the movable optical grating to move within the limitation of the bayonet 21, thereby closing or opening the fixed optical grating 20. At least one end of the movable electrode 32 of the MEMS light valve provided according to embodiments of the present disclosure is suspended, so that the MEMS light valve may be sensitive to electrostatic forces. When there are electric potential differences between the movable electrode 32 and the fixed electrodes 33, 34, the movable electrode 32 may be sensitive to electrostatic forces applied from the fixed electrodes 33, 34. Therefore, sensitivity of the MEMS light valve may be increased, and reliability of the display device may be improved.

In a specific embodiment as shown in FIG. 1a, the fixed electrodes 33 and 34 are symmetrically disposed on two sides of the movable electrode 32. The action mechanism of the MEMS light valve 30 will be illustrated as follows. When the display device is in a normal working status, the bayonet 21 is inherently in contact with and electrically coupled to the movable optical grating 31. Since the movable optical grating 31 is electrically coupled to the movable electrode 32, the bayonet 21 can be electrically coupled to the movable electrode 32. Therefore, if a 0V voltage is applied to the bayonet 21, the 0V voltage is also applied to the movable electrode 32. Besides, a 5V voltage may be applied to the fixed electrode 33, and a 0V voltage may be applied to the fixed electrode 34. In such configuration, an electric potential difference may exist between the fixed electrode 33 and the movable electrode 32, thus an electrostatic force may be generated between the fixed electrode 33 and the movable electrode 32 due to the electric potential difference. The fixed electrode 33 may carry positive charge, while the movable electrode 32 may carry negative charge. In conclusion, the movable electrode 32 may be subject to a leftward electrostatic force. As the movable electrode 32 is suspended, the fixed electrode 33 is capable of pulling the movable electrode 32 leftward, such that the movable optical grating 32 connected with the movable electrode 32 can move to the left.

To move the movable optical grating 31 to its original position, a 5V voltage may be applied to the fixed electrode 33, a 0V voltage may be applied to the fixed electrode 34, and a 5V voltage may be applied to the movable electrode 32 through the bayonet 21. In such configuration, an electric potential difference may exist between the fixed electrode 34 and the movable electrode 32. And due to the electric potential, an electrostatic force may be generated between the fixed electrode 34 and the movable electrode 32. The movable electrode 32 may carry positive charge, while the fixed electrode 34 may carry negative charge. In conclusion, the movable electrode 32 may be subject to a rightward electrostatic force. As the movable electrode 32 is suspended, the fixed electrode 34 may be capable of pulling the movable electrode to the right. Such that, the movable optical grating connected with the movable electrode 32 can move rightward till it returns to the original position.

It should be noted that the above described voltage values are merely for illustrating the action mechanism of the MEMS light valve. In practice, the voltages applied to the electrodes may be adjusted based on real situations.

In some embodiments, the fixed electrodes 33, 34 and the movable electrode 32 are not parallel. Specifically, a distance between the fixed electrode 33 and the movable electrode 32, and/or a distance between the fixed electrode 34 and the movable electrode 32, may become a minimum value at the suspended end of the movable electrode 32. Therefore, charge may accumulate at the suspended end. Such that, even when the electric potential differences between the movable electrode 32 and the fixed electrodes 33, 34 are relatively small, the fixed electrodes 33, 34 may still be able to attract the movable electrode 32 to move. In some embodiments, the fixed electrodes 33, 34 and the movable electrode 32 may be in parallel with each other.

In some embodiments, the MEMS light valve may include at least two of the movable electrodes 32 which are symmetrically disposed on two lateral sides of the movable optical grating 31. Each of the movable electrodes 32 has a corresponding fixed electrode 33, and the fixed electrodes should be on different sides of the movable optical grating 31. Referring to FIG. 1a, in some embodiments, the movable electrode 32 on the left of the movable optical grating 31 may only have one corresponding fixed electrode 33 which is on the left side of the movable electrode 32, and the movable electrode 32 on the right of the movable optical grating 31 may only have one corresponding fixed electrode 34 which is on the right side of the movable electrode 32. In some embodiments, the movable electrode 32 on the left of the movable optical grating 31 may only have one corresponding fixed electrode 34, and the movable electrode 32 on the right of the movable optical grating 31 may only have one corresponding fixed electrode 33.

In the display device, there may be provided with a plurality of fixed optical gratings 20 and a plurality of MEMS light valves 30 arranged in array. Only one fixed optical grating 20 and one MEMS light valve 30 may be described here as an example.

In some embodiments, the substrate 10 includes a backlight source therein. The backlight source may include a blue light source, a red light source and a green light source which may be provided by a blue light LED, a red light LED and a green light LED, or provided by laser beams which can generate beams with red, green and blue colors.

Referring to FIG. 1b, a thin film transistor (TFT) array (not shown in FIG. 1b) is formed on the fixed optical grating 20 within a region which is not used to control luminousness. The bayonet 21, the fixed electrodes 33 and 34 are respectively electrically coupled to corresponding TFT switches, thus voltages may be applied thereto through the corresponding TFT switches. In some embodiments, the substrate 10 includes a backlight source, and a surface of the fixed optical grating 20 facing the backlight source have a reflection rate greater than 60%.

In some embodiments, referring to FIG. 22, the MEMS light valve may be disposed on the substrate 10, and the fixed optical grating 20' may be disposed on the MEMS light valve. That is to say, the MEMS light valve and the fixed optical grating may be disposed upside down. Accordingly, the TFT array may be formed on substrate 10.

Referring to FIG. 1a, in a specific embodiment, the fixed optical grating 20 may be rectangle, having a top side, a bottom side and two lateral sides. The bottom side is a side which is close to the ground when the display device is in normal working status. The top side is opposite to the bottom side. Since the fixed optical grating 20 is a rectangle, the movable optical grating 31 corresponding to the fixed optical grating 20 is also rectangle and have a first side, a second side, a third side and a fourth side. The first side and the third side are opposite to each other and are respectively corresponding to the top side and bottom side of the fixed optical grating 20. The first side is corresponding to the top side of the fixed optical grating 20. The third side is corresponding to the bottom side of the fixed optical grating 20. The second side and the fourth side are opposite to each other and are respectively corresponding to two lateral sides of the fixed optical grating 20. Two of the bayonets 21 are fixedly mounted on the substrate 10 and are respectively disposed on the first side and third side of the movable optical grating 31. The first and third sides of the movable optical grating 31 are configured in the two bayonets 21. The movable optical grating 31 may move along the bayonets 21.

There are a plurality of strip-shaped nonopaque openings on both the fixed optical grating 20 and the movable optical grating 31. The openings are parallel with the second side. When the nonopaque openings of the fixed optical grating 20 and the movable optical grating 31 coincide, i.e., when the nonopaque openings of the fixed optical grating 20 are not completely covered by opaque parts of the movable optical grating 31, light emitted from the backlight source in the substrate 10 can penetrate through the nonopaque openings of the fixed optical grating 20 and the movable optical grating 31. Further, quantity of the light penetrating through the openings can be adjusted based on a range of the nonopaque openings of the fixed optical grating 20 being covered by the opaque parts of the movable optical grating 31.

In some embodiments, the width of the nonopaque openings and the width of the opaque parts between each two neighboring nonopaque openings of the movable optical grating 31 are greater than the width of the nonopaque openings of the fixed optical grating 20. As such, it may be ensured that the nonopaque openings of the movable optical grating 31 can completely expose the nonopaque openings of the fixed optical grating 20 at a certain position, and the opaque parts of the movable optical grating 31 can completely cover the nonopaque openings of the fixed optical grating 20 at another certain position.

In some embodiments, the bayonet 21 may have a lateral cross section like an "L". The L-shaped bayonet 21 constitutes a U-shaped groove together with the substrate 10. The movable optical grating 31 of the MEMS light valve can be disposed in the U-shaped groove. The bayonet 21 may include a conductive material. Besides, the bayonet 21 may be provided with a dielectric layer on its outer surface. The movable optical grating 31, the movable electrode 32 and the fixed electrodes 33, 34 of the MEMS light valve 30 may also include a conductive material. The conductive material mentioned above may be metal, such as Au, Ag, Cu, Al, Ti, Cr, Mo, Cd, Ni, Co, or a combination thereof. The conductive material may be a conductive nonmetal material, such as poly-silicon, amorphous silicon, amorphous silicon germanium, poly-silicon germanium, or the like. The conductive material may also be a combination of a metal and a conductive nonmetal material. In some embodiments, Al is selected. Since both the bayonet 21 and the movable optical grating 31 of the MEMS light valve include a conductive material, they can be electrically coupled when they are in contact with each other. Therefore, when a voltage is applied to the bayonet 21, the bayonet 21 and the movable optical grating 31 may have the same electric potential.

It should be noted that the bayonet 21 may not be limited to be L-shaped. As long as the movable optical grating 31 can be disposed in the bayonet 21, the bayonet 21 can have other shapes, such as a U shape. In some embodiments, the bayonet 21 may be replaced with a T-shaped rail. And the movable optical grating may be provided with a groove corresponding to the T-shaped rail. Those skilled in the art may vary the shape of the bayonet 21 without departing from the scope of the present disclosure.

The movable electrode 32 and the fixed electrodes 33, 34 may be vertical to the substrate, and may have a height (marked as "h" in FIG. 1*a*) to width (marked as "d" in FIG. 1*a*) ratio larger than 1.5. Referring to FIG. 1*a*, in some embodiments, the movable electrode 32 may have an L-like shape which includes two plates 321 and 322 connected in integration. One end of the plate 321 of the movable electrode 32 may be fixedly connected with the movable optical grating 31, and one end of the plate 322 may be suspended.

The fixed electrode 33 includes a plate 331 and an end 332 for electrical coupling. The plate 331 is facing the plate 321 of the movable electrode 32, i.e., the two plates are opposite to each other. When voltages are applied to the movable electrode 32 and the fixed electrode 33, and an electric potential difference is generated therebetween, electric charge may accumulate on the two opposing plates and an electrostatic force may be generated. The end 332 is used to be electrically coupled to a TFT switch. Therefore, a voltage can be applied to the fixed electrode 33 through the TF switch. The fixed electrode 34 includes a plate 341 and an end 342 for electrical coupling. The plate 341 is facing the plate 321 of the movable electrode 32, i.e., the two plates are opposite to each other. When voltages are applied to the movable electrode 32 and the fixed electrode 34, and an electric potential difference is generated therebetween, electric charge may accumulate on the two opposing plates and an electrostatic force may be generated. The end 342 is used to be electrically coupled to a TFT switch. Therefore, a voltage can be applied to the fixed electrode 34 through the TF switch.

In some embodiments, there are four movable electrodes 32, four fixed electrodes 33 and four fixed electrodes 34 which are symmetrically arranged on the second and fourth sides of the movable optical grating 31, respectively. However, the scope of the present disclosure may not be limited to such configuration. The number of the movable electrodes 32 and the fixed electrodes 33, 34 may be determined based on practical requirements.

Figure 2:
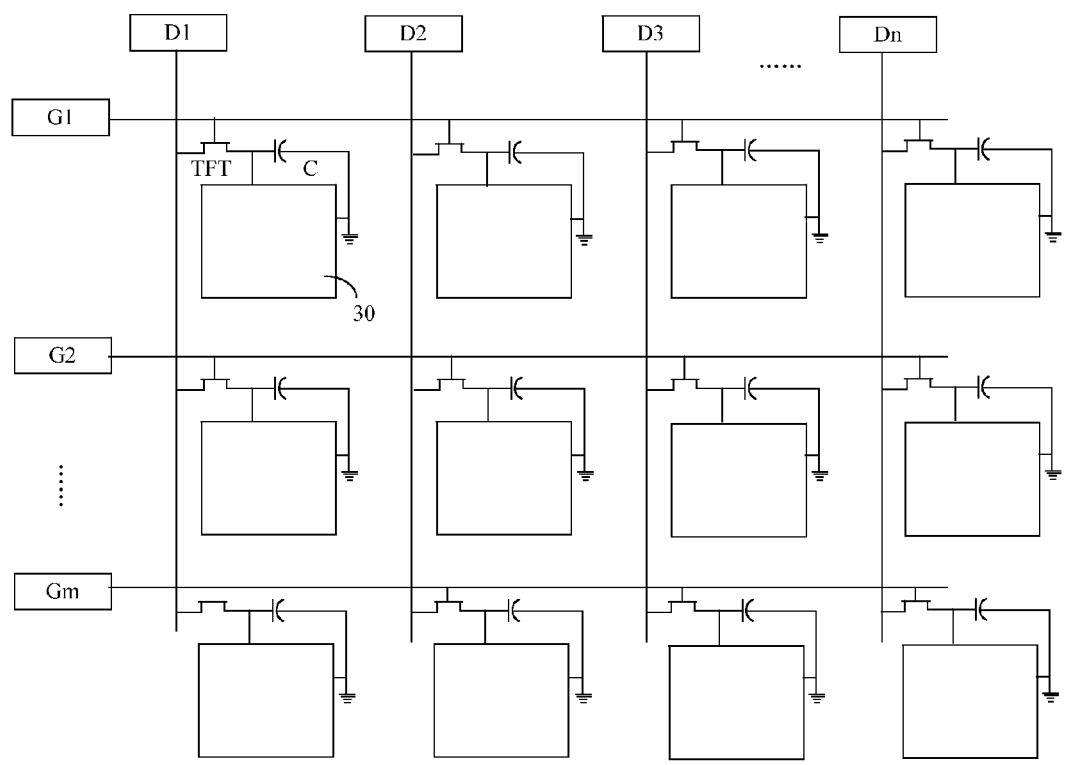
FIG. 2 schematically illustrates a circuit structure of a display device with a MEMS light valve according to one embodiment of the present disclosure.

FIG. 2 schematically illustrates a circuit structure of the display device according to one embodiment. Referring to FIG. 2, the display device further includes: a plurality of scan lines G1, G2 . . . Gm on the substrate; and a plurality of data lines D1, D2 . . . Dn on the substrate. The plurality of scan lines G1, G2 . . . Gm are parallel with each other, and the plurality of data lines D1, D2 . . . Dn are parallel with each other. The plurality of scan lines G1, G2 . . . Gm are vertical with the plurality of data lines D1, D2 . . . Dn. The plurality of data lines D1, D2 . . . Dn are electrically coupled to source electrodes or drain electrodes (depending on types of the sources and drains) of corresponding TFT switches, respectively. The plurality of scan lines G1, G2 . . . Gm are electrically coupled to gate electrodes of the corresponding TFT switches, respectively. The corresponding TFT switches are controlled to open and close using the plurality of scan lines G1, G2 . . . Gm. Voltages are applied to the corresponding TFT switches, which are electrically coupled to corresponding MEMS light valves, using the plurality of data lines D1, D2 . . . Dn. Therefore, voltages applied to the MEMS light valves are controlled using the plurality of data lines D1, D2 . . . Dn. The display device further includes capacitors C to be electrically coupled to the MEMS light valves. It should be noted that not all the TFT switches corresponding to each MEMS light valve 30 are labeled in FIG. 2.

Figure 8:
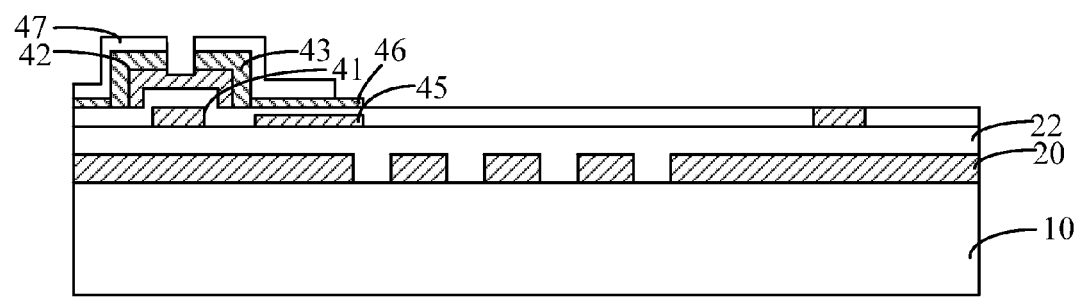
Figure 8D:
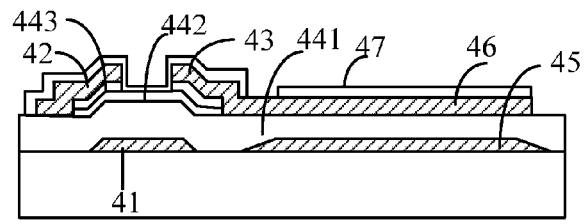

Referring to FIG. 8*d*, the TFT switch provided according to one embodiment includes a gate 41, a source, a drain and a conductive channel for electrically conducting the source and the drain. A gate dielectric layer 441 is formed between the conductive channel and the gate 41. A source electrode 42 is electrically coupled to the source, and a drain electrode 43 is electrically coupled to the drain. The TFT switch further includes a capacitor. The capacitor includes a first plate 45, a second plate 46 and a capacitor dielectric layer (not labeled in FIG. 8*d*) therebetween. The first plate 45 and the gate 41 are in the same layer and include the same material with luminousness less than 50%. The second plate 46, the source electrode 42 and the drain electrode 43 are in the same layer and include the same material with luminousness less than 50%. The second plate 46 is electrically coupled to the source electrode 42 or the drain electrode 43, which may be determined based on the doping type of the source and drain. In a specific embodiment, the second plate 46 is electrically coupled to the drain electrode 43. The second plate 46 is further electrically coupled to the fixed electrodes or the bayonet.

In some embodiments, the conductive channel is a lightly doped silicon layer 442 which is disposed between the gate dielectric layer 441 and a heavily doped silicon layer 443. The heavily doped silicon layer 443 has an opening (not labeled in FIG. 8*d*) which exposes the lightly doped silicon layer 442. The source and drain are in the heavily doped silicon layer 443 on two sides of the opening. In some embodiments, the capacitor dielectric layer and the gate dielectric layer are in the same layer and include the same material. In a manufacturing process, a dielectric layer may be formed on the gate 41 and the first plate 45. The dielectric layer on the gate 41 is the gate dielectric layer, and the dielectric layer on the first plate 45 is the capacitor dielectric layer.

The first plate, the second plate, the gate, the source electrode and the drain electrode may include a metal material, such as Au, Ag, Cu, Al, Ti, Cr, Mo, Cd, Ni, Co or a combination thereof, or selected from Au, Ag, Cu, Al, Ti, Cr, Mo, Cd, Ni, Co, poly-silicon, amorphous silicon, poly-silicon germanium, amorphous silicon germanium, and a combination thereof. The capacitor dielectric layer and the gate dielectric layer may include a material selected from silicon oxide, silicon nitride, silicon carbide, silicon oxynitride, and a combination thereof.

The TFT switches of the present disclosure may be formed in opaque parts of a display device with MEMS light valves, as the MEMS light valves may not need relatively large opening rates. Besides, the first plate, the second plate, the gate, the source electrode and the drain electrode include a material with luminousness less than 50%. Therefore, the TFT switches and the MEMS light valves may be better integrated and thus improving the device performance.

Further, referring to FIG. 1b, in some embodiments, the display device may include a cap layer and a sealing cap. The cap layer 57 may surround the lateral sides of the MEMS light valve and cover the top of the MEMS light valve. The cap layer 57 may have openings (not labeled in FIG. 1b) on top. The sealing cap 59 may seal the openings. In some embodiments, the sealing cap 59 may not only seal the openings, but also overlay the entire top portion of the sealing cap 57. The cap layer 57 and the sealing cap 59 may include a material selected from silicon oxide, silicon nitride, silicon carbide, silicon oxynitride and a combination thereof. The sealing cap 59 may perform a sealing function to prevent steam, dust, impurities and the like from entering into the display device, thereby increasing the service life of the display device.

In embodiments described above, both the fixed optical grating 20 and the movable optical grating 31 are rectangle. However, in some embodiments, the fixed optical grating 20 and the movable optical grating 31 may not be rectangle.

Figure 3:
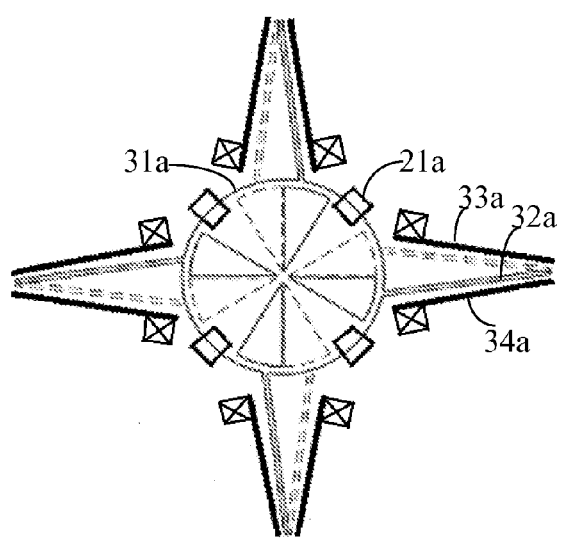
FIG. 3 schematically illustrates a top view of a MEMS light valve according to one embodiment of the present disclosure.

FIG. 3 schematically illustrates a top view of a MEMS light valve according to another embodiment of the present disclosure. The MEMS light valve may have a fixed optical grating which may be round (not shown in FIG. 3) and may have a plurality of nonopaque fan-shaped openings. Referring to FIG. 3, a movable optical grating 31a may have a shape corresponding to the fixed optical grating. The movable optical grating 31an Also may be round and have a plurality of fan-shaped nonopaque openings to be corresponding to the fixed optical grating. A plurality of bayonets 21a may be fixedly mounted on a substrate, which may be disposed long the circular edge of the movable optical grating. The movable optical grating 31a can rotate along its peripheral direction with the limitation of the bayonets 21a. The MEMS light valve may include a plurality of movable electrodes 32a each of which may have one end fixed to and electrically connected to the circular edge of the movable optical grating 31a.

The bayonets 21a are arc-shaped, such that the bayonets 21a can be ideally corresponding to the circular edge of the round movable optical grating 31a. In other words, only arc-shaped bayonets 21a can be corresponding to the round movable optical grating 31a and provide stable support for the round movable optical grating 31a. There may be four movable electrodes 32a, four fixed electrodes 33a and four fixed electrode 34a which are symmetrically arranged along the circular edge of the movable optical grating 31a. In each set of electrodes including a fixed electrode 33a, a fixed electrode 34a and a movable electrode 32a, the fixed electrodes 33a and 34a are disposed on two sides of the movable electrode 32a, respectively. The present disclosure should not be limited to such configuration of the numbers of the fixed electrodes and the movable electrodes. The numbers may be adjusted based on practical requirements.

When certain voltages are applied to the electrodes to generate electric potential differences between the fixed electrodes and the movable electrodes, the MEMS light valve may rotate as a result of electrostatic forces. Therefore, how well the nonopaque openings of the fixed optical grating and the movable optical grating are coinciding with each other can be controlled, thereby controlling the luminousness of the optical gratings. Detail mechanism of the MEMS light valve will not be illustrated here.

Figure 4:
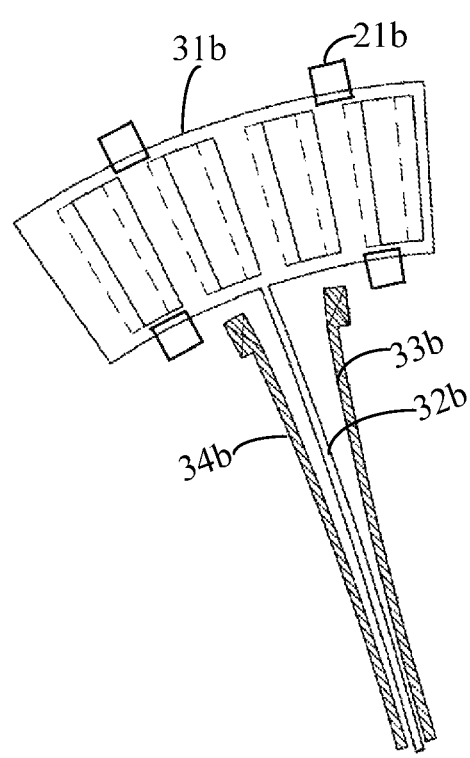
FIG. 4 schematically illustrates a top view of a MEMS light valve according to one embodiment of the present disclosure.

FIG. 4 schematically illustrates a top view of a MEMS light valve according to another embodiment of the present disclosure. The MEMS light valve may include a fan-shaped fixed optical grating (not shown in FIG. 4). The fixed optical grating may have a plurality of strip-shaped nonopaque openings. Referring to FIG. 4, a movable optical grating 31b may be provided with a shape corresponding to that of the fixed optical grating. The movable optical grating 31b may have a plurality of strip-shaped openings (not labeled in FIG. 4). A plurality of bayonets 21b may be fixedly mounted on a substrate and disposed on two arc sides of the movable optical grating. The fan-shaped movable optical grating 31b can rotate along with the arc side thereof within the limitation of the bayonets 21b. The MEMS light valve further includes a movable electrode 32b with one end fixed to and electrically connected with the fan-shaped movable optical grating 31b.

The bayonets 21b are arc-shaped, so as to be corresponding to the two arc sides of the movable optical grating 31b. In some embodiments, there are four bayonets 21b, two of which are disposed on one arc side of the movable optical grating and the other two of which are disposed on another arc side of the movable optical grating. On each arc side, the two bayonets 21b are symmetrically arranged. As such, the bayonets 21b can provide better support the movable optical grating 31b when holding the movable optical grating 31b. In some embodiments, the movable optical grating 31b have two arc sides. The movable electrode 32b may have one end electrically connected to a shorter one of the two arc sides and another end which is suspended. Fixed electrodes 33b and 34b are disposed on two sides of the movable electrode 32b, respectively.

In some embodiments, there may be one movable electrode 32b, one fixed electrode 33b and one fixed electrode 34b. The movable electrode 32b may be electrically connected with the shorter arc side at the middle point of the arc side. That is to say, the end of the movable electrode 32b electrically connected with the shorter arc side may equally divide the shorter arc side. The present disclosure should not be limited to such configuration of the numbers of the fixed electrodes and the movable electrodes. The numbers may be adjusted based on practical requirements.

When certain voltages are applied to the electrodes to generate electric potential differences between the fixed electrodes and the movable electrode, the MEMS light valve may rotate as a result of electrostatic forces. Therefore, how well the nonopaque openings of the fixed optical grating and the movable optical grating are coinciding with each other can be controlled, thereby controlling the luminousness of the optical gratings. Detail mechanism of the MEMS light valve will not be illustrated here.

The shapes of the fixed optical gratings and the movable optical gratings described in embodiments above can be altered by those skilled in the art without departing from the spirit of the present disclosure. It could be understood that the positions of the movable and fixed electrodes may change with the shapes of the fixed and movable optical gratings. However, it should be ensured that one end of the movable electrodes is suspended, such that the sensitivity of the MEMS light valve may be increased and thereby improving the reliability of the display device.

In some embodiments, the TFT switches may be replaced by low temperature poly-silicon TFT (LTPS-TFT) switches.

FIG. 23 schematically illustrates a cross-sectional view of a LTPS-TFT switch. FIG. 24 schematically illustrates applying the LTPS-TFT switch in a display device. Referring to FIG. 23, the LTPS-TFT switch may include: a source 61, a drain 62, a channel region 63 between the source 61 and the drain 62, a gate dielectric layer 64 on the channel 63 and a gate 65 on the gate dielectric layer 64. The source 61 is electrically coupled to a source electrode 66 through a first plug. The drain 62 is electrically coupled to a drain electrode 67 through a second plug. Data lines of the display device (not shown in FIG. 23) are electrically coupled to the source electrode 66. Scan lines of the display device (not shown in FIG. 23) are electrically coupled to the gate 65. The LTPS-TFT switch may further include a capacitor on the source electrode 66 and the drain electrode 67. The capacitor may include a first plate 71, a second plate 72 and a capacitor dielectric layer 73 therebetween. The first plate 71 may be disposed on the drain electrode 67 and electrically coupled to the drain electrode 67. The capacitor dielectric layer 73 is on the first plate 71, and the second plate 72 is on the capacitor dielectric layer 72. The second plate 72 may be electrically coupled to the fixed electrodes or bayonets. In some embodiments, the data lines of the display device may be coupled to the drain electrode 67, while the first plate 71 may be electrically coupled to the source electrode 66. The detail configuration of the switch may be determined based on types of the source and the drain.

In some embodiments, the TFT switches, or the LTPS-TFT switches may be replaced by other switch circuits, such as MEMS switches, and the like.

Figure 5:
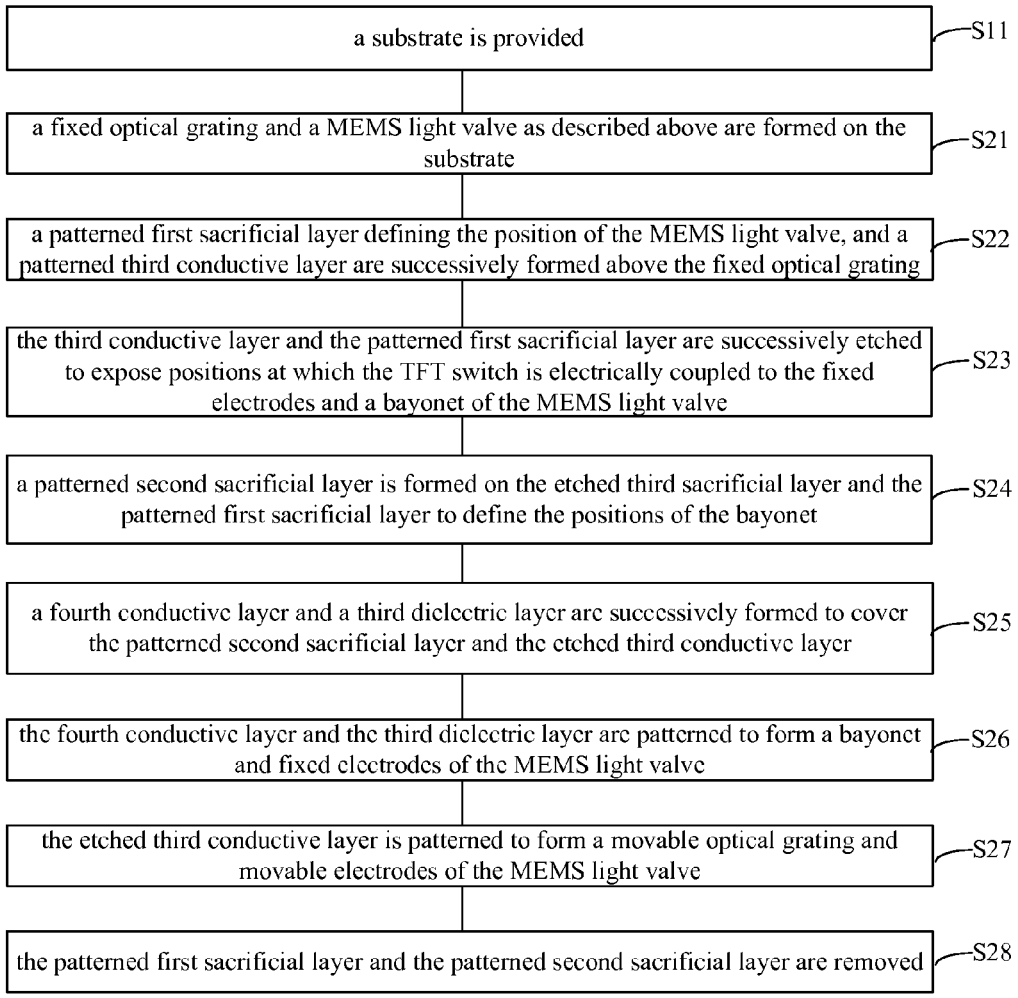
FIG. 5 schematically illustrates a flow chart of a method for forming a display device with a MEMS light valve according to one embodiment of the present disclosure.

Accordingly, methods for forming a display device are provided in the present disclosure. FIG. 5 schematically illustrates a flow chart of a method for forming a display device according to one embodiment. FIGS. 6 to 21 are schematic cross-sectional views of intermediate structures formed in the formation process of the display device. The method for forming a display device will be described in detail with reference to FIG. 5 and FIGS. 6 to 21.

Figure 6:
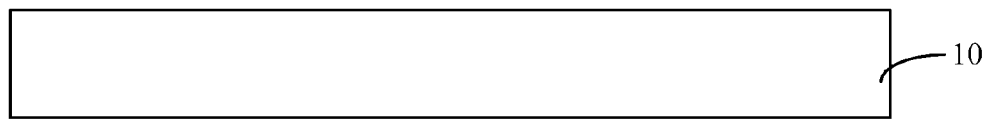
FIGS. 6 to 21 schematically illustrate cross-sectional views of intermediate structures formed in a process for forming a display device with a MEMS light valve according to one embodiment of the present disclosure.

Referring to FIGS. 5 and 6, performing step S11, a substrate 10 is provided. In some embodiments, the substrate 10 may be a glass substrate. In some embodiments, the substrate 10 includes a backlight source therein. The backlight source may include a blue light source, a red light source and a green light source which may be provided by a blue light LED, a red light LED and a green light LED, or provided by laser beams which can generate beams with red, green and blue colors.

Figure 7:
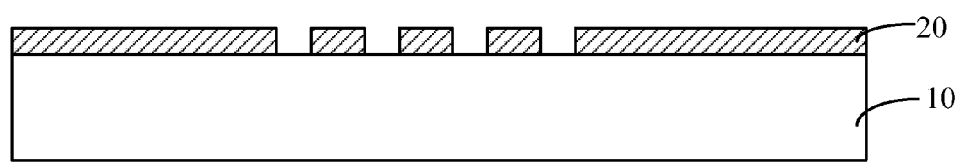

Referring to FIGS. 5 and 7, performing step S21, a fixed optical grating 20 and a MEMS light valve as described above are formed on the substrate 10. In some embodiments, forming the fixed optical grating 20 may include: forming a conductive layer on the substrate 10; and patterning the conductive layer to form a fixed optical grating 20 using photolithography and etching. In some embodiments, the fixed optical grating 20 may include a material selected from Au, Ag, Cu, Al, Ti, Cr, Mo, Cd, Ni, Co, and the like. In some embodiments, the fixed optical grating 20 may include Al. In some embodiments, forming the conductive layer may include chemical vapor deposition or physical vapor deposition.

In some embodiments, after the fixed optical grating is formed and before the formation of the MEMS light valve, a TFT switch may be formed on the fixed optical grating.

Referring to FIG. 8, in some embodiments, after the fixed optical grating 20 is formed, a dielectric layer 22 is formed to cover the fixed optical grating 20. The dielectric layer 22 may include $SiO_2$, SiOC, SiON, or a combination thereof. The dielectric layer 22 may be formed using chemical vapor deposition. Thereafter, TFT switches are formed on the dielectric layer 22. Each switch may be corresponding to a fixed electrode and a bayonet.

In some embodiments, forming the TFT switch may include following steps.

Referring to FIGS. 8a1 and 8a2, performing step a, a first conductive layer is formed above the fixed optical grating. The first conductive layer may include a material with a luminousness less than 50%. The material of the first conductive layer may be selected by referring to above description about the TFT switch. In some embodiments, the first conductive layer may have a stacked structure including a Ti layer, an Al layer and a Ti layer, or a stacked structure including an Al layer and a Mo layer. Or else, the first conductive layer may be a Cr layer, a Mo layer or a Ta layer. The first conductive layer may be formed using chemical vapor deposition or physical vapor deposition. Thereafter, performing step b, the first conductive layer is patterned to form a gate 41 and a first plate 45. Specifically, after exposure with a mask, development and dry etch, the gate 41, the first plate 45 and a scan line 48 are formed in the first conductive layer.

Referring to FIGS. 8b1 and 8b2, performing step c, a first dielectric layer 441 is formed to cover the gate and the first plate. The first dielectric layer on the first plate is to be used as a capacitor dielectric layer. Performing step d, a lightly doped silicon layer 442 and a heavily doped silicon 443 are successively formed on the first dielectric layer on the gate 41. The heavily doped silicon layer 443 has an opening, on two sides of which are formed a source and a drain. The opening exposes the lightly doped silicon layer 442 which constitutes a conductive channel.

In some embodiments, the first dielectric layer may include $SiO_2$, SiN, SiON, SiOC, or the like, or a combination thereof. Using plasma enhanced chemical vapor deposition (PECVD) to continuously forming films, the first dielectric layer 441, the lightly doped silicon layer 442 and the heavily doped silicon layer 443 can be formed. Specifically, the first dielectric layer 441 is firstly formed using PECVD to cover the first plate 45, the gate 41 and the scan line 48. Then the lightly doped silicon layer 442 is formed on the first dielectric layer 441. Then the heavily doped silicon layer 443 is formed on the lightly doped silicon layer 442. Thereafter, the lightly doped silicon layer 442 and the heavily doped silicon layer 443 are patterned using photolithography (including mask formation and exposure) and dry etch. Therefore, the heavily doped silicon layer 443 and the lightly doped silicon layer 442 on the first dielectric layer 441 which is on the gate 41 are remained. Thereafter, the heavily doped silicon layer 443 is patterned to form an opening (not labeled in FIGS. 8b1 and 8b2). The heavily doped silicon layer 443 on two sides of the opening respectively constitute the source and drain. The opening exposes the lightly doped silicon layer 442 which constitutes the conductive channel.

Referring to FIGS. 8c1 and 8c2, performing step e, a second conductive layer is formed to cover the first dielectric layer 441, the remained lightly doped silicon layer 442 and heavily doped silicon layer 443. The second conductive layer may include a material with a luminousness less than 50%. Thereafter, performing step f, the second conductive layer is patterned to form a source electrode 42 electrically coupled to the source, a drain electrode 43 electrically coupled to the drain and a second plate. The second plate 46, the first plate 45 and the first dielectric layer on the first plate 45 constitute a capacitor. The second plate 46 is electrically coupled to the source electrode 42 or the drain electrode 43. In some embodiments, when the second conductive layer is patterned, a data line 49 is also formed. In some embodiments, the second plate 46 is electrically coupled to the source electrode and the data line 49 is electrically coupled to the drain electrode. In some embodiments, the second plate 46 is electrically coupled to the drain electrode and the data line 49 is electrically to the source electrode. Detail coupling relationship may be determined based on types of the source and the drain.

The material of the second conductive layer can be selected by referring to above description of the TFT switch. In some embodiments, the second conductive layer may have a stacked structure including a Ti layer, an Al layer and a Ti layer, or a stacked structure including an Al layer and a Mo layer. Or else, the first conductive layer may be a Cr layer, a Mo layer or a Ta layer. The second conductive layer may be formed using chemical vapor deposition or physical vapor deposition.

Referring to FIG. 8d, in some embodiments, after the formation of the TFT switch, a passivation layer 47 is formed using PECVD. The passivation layer 47 may include silicon oxide, silicon nitride, silicon carbide, silicon oxynitride or a combination thereof. Thereafter, the passivation is subject to an exposure with a mask and a dry etch process to be patterned. The patterned passivation layer functions as a protecting film to protect the TFT switch.

Referring to FIGS. 5, 9, 10 and 11, performing step S22, a patterned first sacrificial layer 51 and a patterned third conductive layer 52 are successively formed above the fixed optical grating 20. The patterned first sacrificial layer 51 defines a position of the MEMS light valve. In some embodiments, the patterned first sacrificial layer 51 and the patterned third conductive layer 52 are not directly formed on the fixed optical grating 20. The passivation layer 47 (referring to FIG. 8d) is formed between the fixed optical grating 20 and the patterned first sacrificial layer 51.

Figure 9:
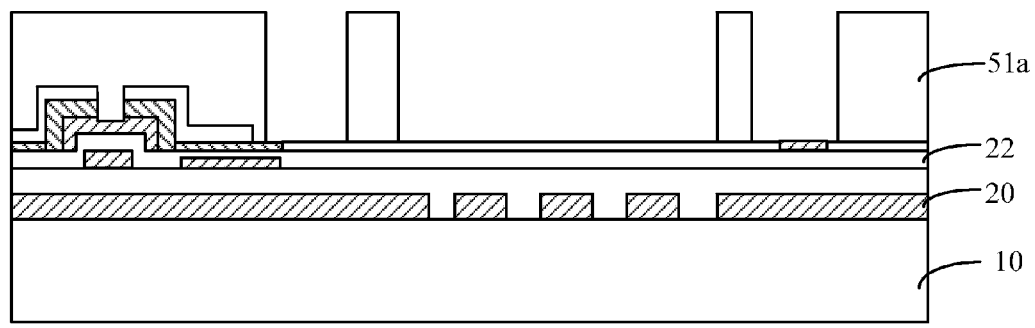
Figure 10:
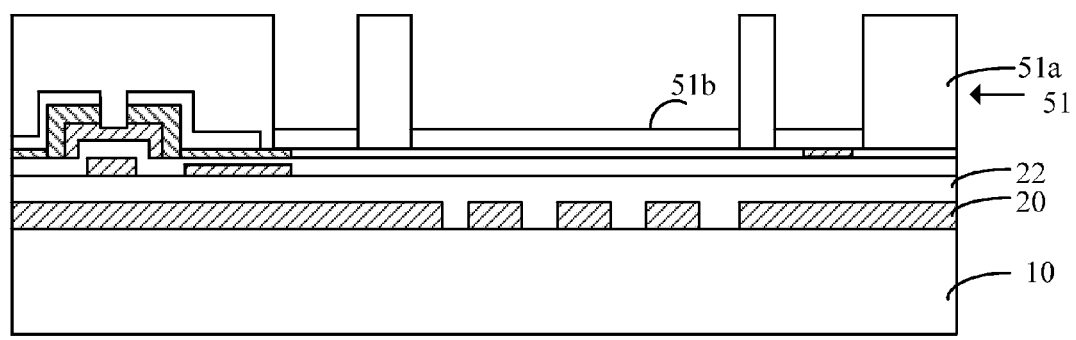

Referring to FIG. 9, forming the patterned first sacrificial layer 51 may include: forming a first sacrificial layer above the fixed optical grating 20, which first sacrificial layer covering components above the fixed optical grating 20. In some embodiments, the first sacrificial layer may include amorphous carbon, which may be formed using chemical vapor deposition commonly used in CMOS processes. After the formation of the first sacrificial layer, the first sacrificial layer is patterned using photolithography to form a sacrificial layer 51a with a predefined pattern. Therefore, the position of the MEMS light valve may be defined. Referring to FIG. 10, after the formation of the sacrificial layer 51a with the predefined pattern, a sacrificial layer 51b with a predefined pattern is formed at positions of the sacrificial layer which is removed. The patterned sacrificial layer 51a and the patterned sacrificial layer 51b together constitute the first sacrificial layer 51. In some embodiments, the predefined sacrificial layer 51b also may include amorphous carbon, which may be formed using chemical vapor deposition commonly used in CMOS processes.

Figure 11:
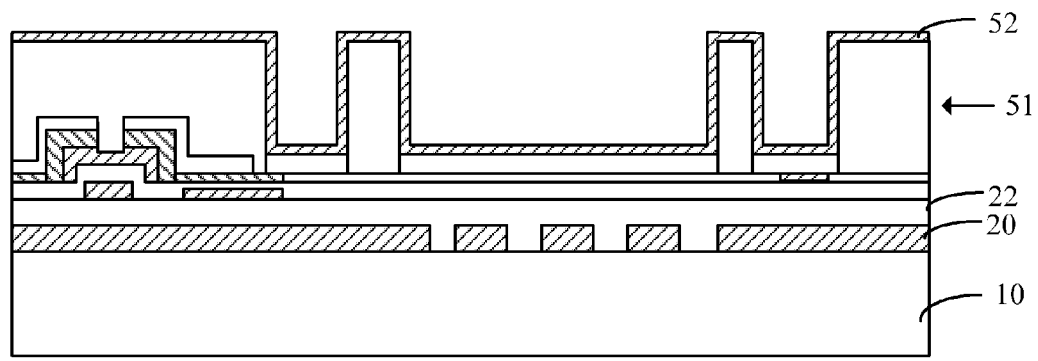

Referring to FIG. 11, a third conductive layer 52 is formed on the patterned first sacrificial layer 51. In some embodiments, the third conductive layer 52 may include metal, such as Au, Ag, Cu, Al, Ti, Cr, Mo, Cd, Ni, Co, or a combination thereof. The third conductive layer 52 may include a conductive nonmetal material, such as poly-silicon, amorphous silicon, amorphous silicon germanium, poly-silicon germanium, or the like. The third conductive layer 52 may include a combination of a metal and a conductive nonmetal material. The third conductive layer 52 may be formed using CVD or PVD. In some embodiments, Al is selected.

Figure 12:
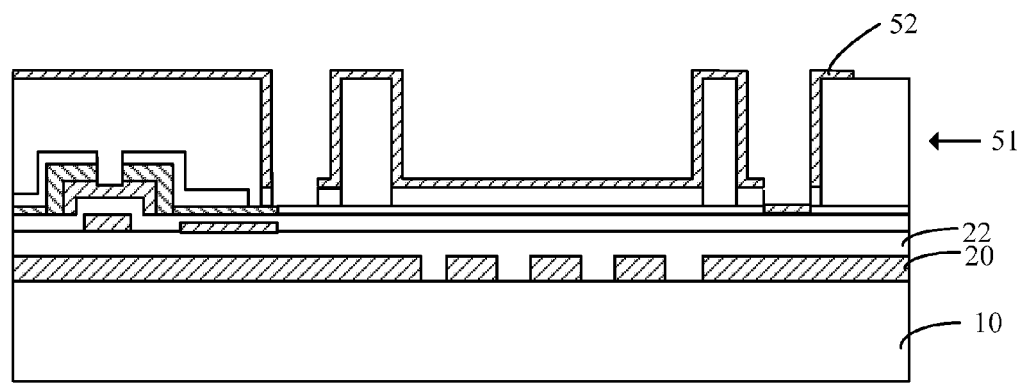

Referring to FIGS. 5 and 12, performing step S23, the third conductive layer 52 and the patterned first sacrificial layer 51 are successively etched to expose positions at which the TFT switch is electrically coupled to the fixed electrodes and a bayonet of the MEMS light valve. The exposed positions are at which the fixed electrodes are electrically coupled to the TFT switch and positions at which the bayonet is electrically coupled to the TFT switch are defined. Specifically, the second plate of the TFT switch is electrically coupled to the fixed electrodes and the bayonet of the MEMS light valve.

Figure 13:
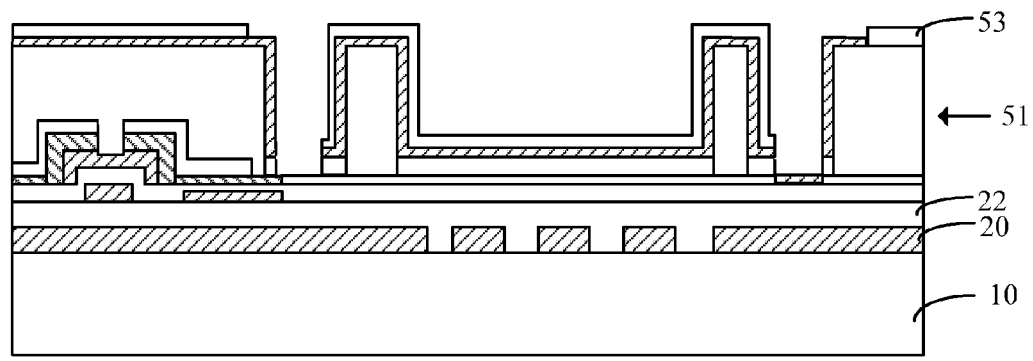

Referring to FIGS. 5 and 13, performing step S24, a patterned second sacrificial layer 53 is formed on the etched third sacrificial layer 52 and the patterned first sacrificial layer 51 to define the positions of the fixed electrodes and the bayonet. In some embodiments, the patterned second sacrificial layer 53 may include amorphous carbon and may be formed using CVD.

Figure 14:
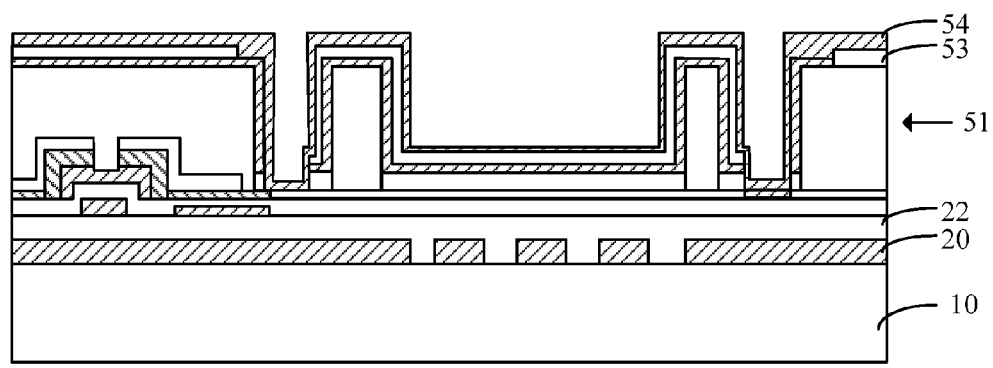

Referring to FIGS. 5 and 14, performing step S25, a fourth conductive layer 54 and a third dielectric layer (the third dielectric layer not shown in FIG. 14) are successively formed to cover the patterned second sacrificial layer 53 and the etched third conductive layer 52, i.e., to cover the components above the substrate 10. In some embodiments, the fourth conductive layer 54 may include metal, such as Au, Ag, Cu, Al, Ti, Cr, Mo, Cd, Ni, Co, or a combination thereof. The fourth conductive layer 54 may include a conductive nonmetal material, such as poly-silicon, amorphous silicon, amorphous silicon germanium, poly-silicon germanium, or the like. The fourth conductive layer 54 may include a combination of a metal and a conductive nonmetal material. In some embodiments, the third dielectric layer may include silicon oxide, silicon nitride, silicon carbide, silicon oxynitride, or a combination thereof. The fourth conductive layer 54 may be formed using PVD or CVD. In some embodiments, the fourth conductive layer 54 may include AL.

Figure 15:
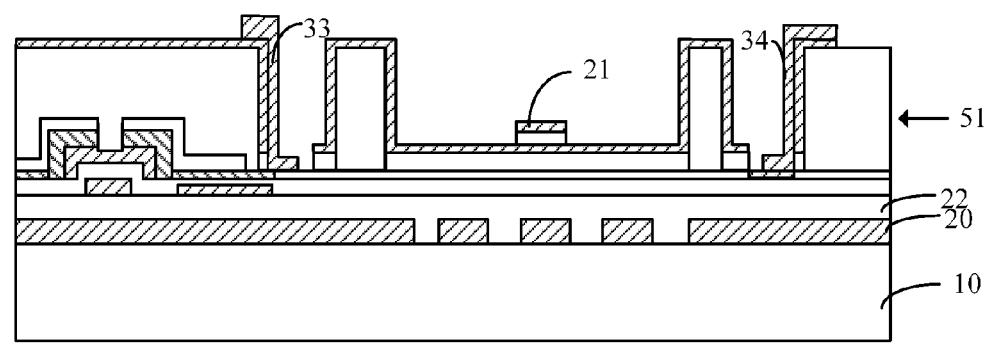

Referring to FIGS. 5 and 15, performing step S26, the fourth conductive layer 54 and the third dielectric layer are patterned to form a bayonet 21 and fixed electrodes 34 of the MEMS light valve (in FIG. 15, the bayonet 21 electrically coupled to the TFT switch is not shown). Referring to FIGS. 1a and 1b, based on the MEMS light valve of the present disclosure, it could be concluded that the bayonet 21 is used to accommodate the movable optical grating 31, so that the bayonet 21 should match with the movable optical grating formed subsequently. In some embodiments, patterning the fourth conductive layer and the third dielectric layer may be implemented by wet etch. Besides, in some embodiments, the wet etch may further remove some portions of the patterned second sacrificial layer 53, which portions are disposed between the third conductive layer and the fourth conductive layer and are not covered by the patterned photoresist. In step S26, when the fixed electrodes 34 of the MEMS light valve are formed, due to the processing limitations, portions of the third conductive layer constituting parts of the fixed electrodes have not yet patterned, such portions may need to be etched together with a movable optical grating and movable electrodes in step 27. It should be noted that, in FIG. 15, not all the fixed electrodes in FIG. 1a are illustrated, but only one fixed electrode 33 and one fixed electrode 34 are shown.

Figure 16:
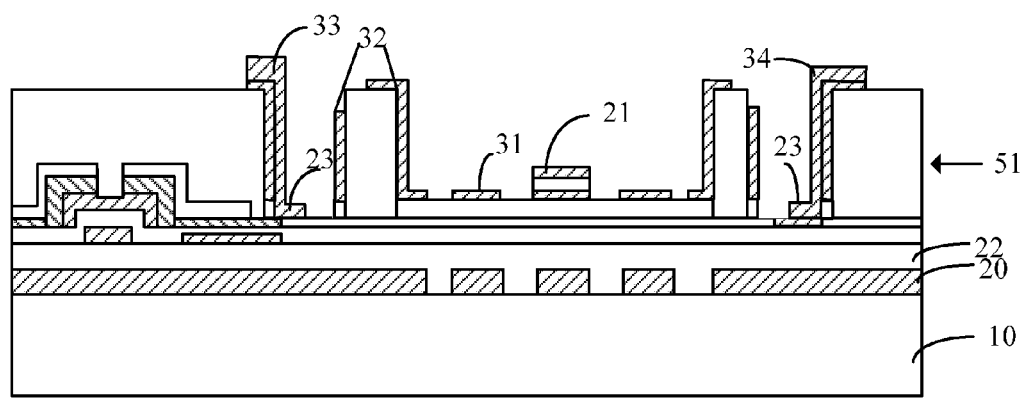

Referring to FIGS. 5 and 16, and with conjunction to FIG. 1a, performing step S27, the etched third conductive layer 52 is patterned to form a movable optical grating 31 and movable electrodes 32 of the MEMS light valve. Besides, in step S27, the parts of the fixed electrodes 33 and 34, which parts are in the third conductive layer are formed using etch. It should be noted that the fixed electrodes 33 and 34 may respectively include two parts, one part in the third conductive layer and the other part in the fourth conductive layer. The part in the fourth conductive layer is electrically coupled to the second plate of the TFT switch. Referring to FIGS. 1a and 1b, and referring to steps S26 and S27, when the third conductive layer 52 and the fourth conductive layer 54 are patterned, the patterns of the two conductive layers should be corresponding with each other, such that the MEMS light valve can be formed. Coupling components 23 are respectively corresponding to the end 332 of the fixed electrode 33 for electrical coupling and the end 342 of the fixed electrode 34 for electrical coupling.

Referring to FIGS. 5 and 17-20, performing step S28, the patterned first sacrificial layer and the patterned second sacrificial layer are removed. In some embodiments, before removing the sacrificial layers, the process may further include following steps.

Figure 17:
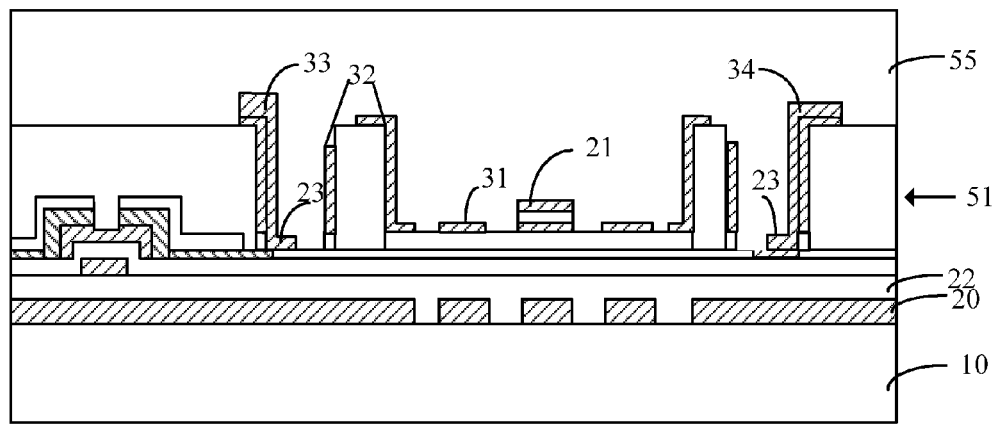

First, referring to FIG. 17, a third sacrificial layer 55 is formed to cover components above the substrate 10. In some embodiments, the third sacrificial layer may include amorphous carbon and may be formed using CVD commonly used in CMOS.

Figure 18:
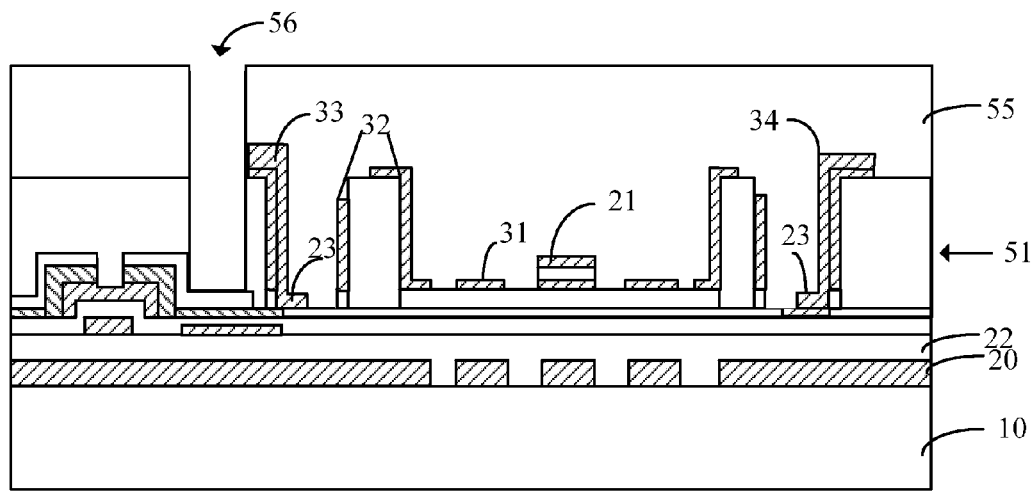

Referring to FIG. 18, the third sacrificial layer 55 is patterned to form an isolation groove between neighboring MEMS light valves. The isolation groove 56 can isolate the MEMS light valve with other MEMS light valves. The isolation groove 56 may be ring-shaped. Patterning the third sacrificial layer 55 may include common photolithography and etch processes. In some embodiments, forming the isolation groove may be optional.

Figure 19:
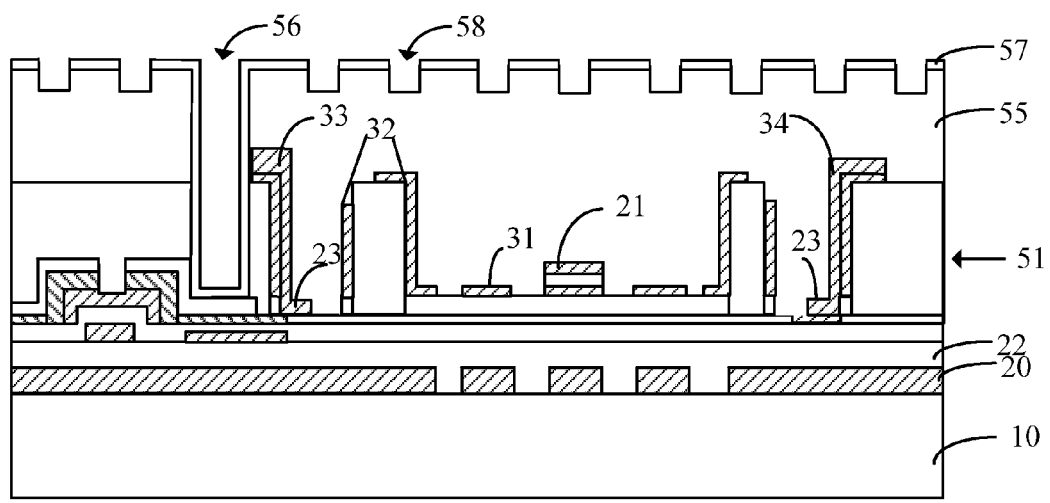

Referring to FIG. 19, a cap layer 57 is formed on the third sacrificial layer 55. The cap layer 57 covers on the top surface and lateral sides of the patterned third sacrificial layer 55. The cap layer 57 includes a plurality of openings 58 which expose the third sacrificial layer 55. The cap layer 57 encompasses the MEMS light valve and covers the top surface of the MEMS light valve. The cap layer 57 includes a top cap 571 and a surrounding cap 572. The surrounding cap 572 is fixed with the substrate 10. The surrounding cap 572 is a surrounding sealing cap, which can protect the MEMS light valves.

In some embodiments, the cap layer may include silicon oxide, silicon nitride, silicon carbide or silicon oxynitride. In some embodiments, silicon oxide may be selected. Forming the cap layer 57 may include: referring to FIG. 19, a silicon oxide layer is formed using CVD to cover the patterned third sacrificial layer 55; and the silicon oxide layer is etched using photolithography and etch processes to form the cap layer 57 with the openings 58 which expose the third sacrificial layer 55. The openings 58 have a depth to width ratio ranging from about 0.5 to about 20 and an aperture ranging from about 0.1 micrometers to about 10 micrometers.

Figure 20:
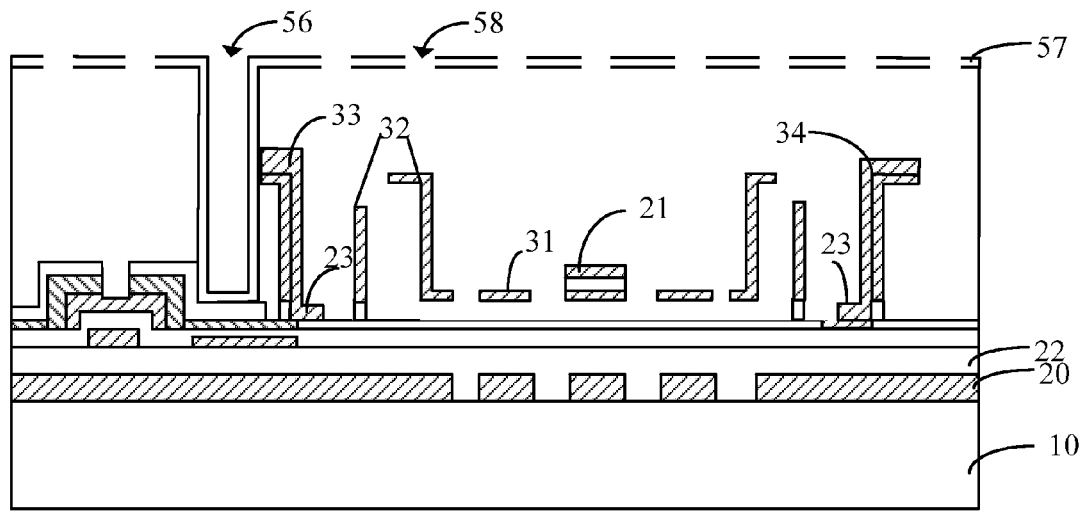

Referring to FIG. 20, the patterned first, second and third sacrificial layers are removed, which may include: ionizing oxygen to form oxygen plasma; and inletting the oxygen plasma into the openings to ash the amorphous carbon at a temperature ranging from about 150° C. to about 450° C.

Figure 21:
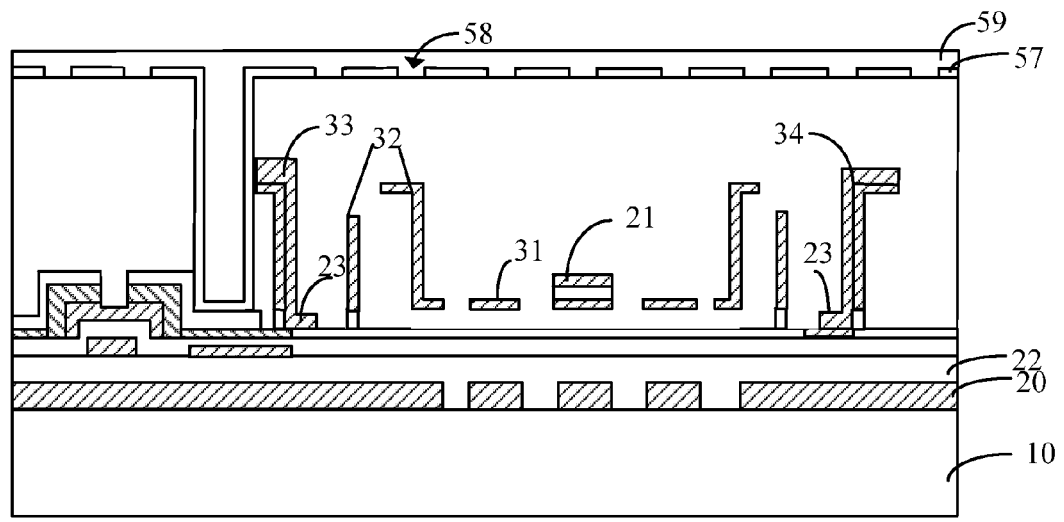

Referring to FIG. 21, in some embodiments, after the display device described above is formed, the process may further include: forming a sealing cap 59 to seal the openings 58. The sealing cap 59 may include silicon oxide, silicon nitride, silicon carbide or silicon oxynitride, and may be formed using CVD. The sealing cap 59 may perform a sealing function to prevent steam, dust, impurities and the like from entering into the display device, thereby increasing the service life of the display device.

In embodiments described above, the fixed optical grating is formed on the substrate before the MEMS light valve is formed above the fixed optical grating. In some embodiments, the MEMS light valve may be formed on the substrate and then the fixed optical grating may be formed on the MEMS light valve. FIG. 22 schematically illustrates a cross-sectional view of a fixed optical grating formed on a MEMS light valve. Referring to FIG. 22, in some embodiments, a MEMS light valve is formed on the substrate 10. The MEMS light valve includes a movable optical grating 31', a movable electrode 32', and fixed electrodes 33' and 34'. Since the MEMS light valve is preferentially formed, to be corresponding to a fixed optical grating 20' to be formed subsequently, positions of the movable optical grating 31' relative to the movable electrode 32', and the fixed electrodes 33' and 34' may be adjusted. The movable optical grating 31' is moved upwardly to be close to the fixed optical grating 20'. After the MEMS light valve is formed, a cap layer 57 and a sealing cap 59 are formed, and the fixed optical grating 20' is formed on the sealing cap 59. In some embodiments, position of a bayonet 21' on the fixed optical grating 20' may need to be changed. Specific embodiments regarding such configuration may be easily conceived by those skilled in the art based on above embodiments illustrated in detail. Besides, those skilled in the art can conceive the method for forming such display device based on above descriptions about the formation process. Detail descriptions about such configurations may be omitted here.

Formation of the display device illustrated in FIG. 1a using the method is illustrated in detail. The method is also capable of forming the display devices illustrated in FIGS. 3 and 4, in which suitable masks may need to be adjusted in patterning processes.

Referring to FIGS. 23 and 24, in some embodiments, forming a LTPS-TFT switch may include:

Step 1), forming a silicon layer on the substrate or the fixed optical grating. As shown in FIG. 24, the silicon layer is formed on the fixed optical grating 20. In some embodiments, the MEMS light valve is formed before the fixed optical grating is formed, so the silicon layer is formed on the substrate 10.

Step 2), transforming the silicon layer into a polysilicon layer using crystallization.

Step 3), patterning the polysilicon layer to form a patterned polysilicon layer. Regions for source 61, a drain 61 and a channel 63 are defined. In some embodiments, the channel may be doped in the step to adjust a threshold voltage.

Step 4), forming a gate dielectric layer 64 to cover the patterned polysilicon layer.

Step 5), forming a patterned mask layer on the gate dielectric layer and performing ion implantation to the patterned polysilicon layer with the patterned mask layer as a mask. Therefore, the source 61 and the drain 62 are formed.

Step 6), removing the patterned mask layer and forming a gate 65 on the gate dielectric layer.

Step 7), forming an interlayer dielectric layer (not labeled in figures) to cover the gate dielectric layer 64 and the gate 65. The interlayer dielectric layer may include silicon oxide.

Step 8), forming, in the gate dielectric layer 64 and the interlayer dielectric layer, a first conductive plug (not labeled in figures) electrically coupled to the source 61 and a second plug (not labeled in figures) electrically coupled to the drain 62. Formations of the first and second conductive plugs are well known in the art.

Step 9), forming a source electrode 66 on the first conductive plug and a drain electrode 67 on the second conductive plug.

Step 10), forming a patterned pas sivation layer on the interlayer dielectric layer, the first and second conductive plugs. The patterned passivation layer includes an opening which exposes the source electrode 67 or the source electrode 66. Whether the opening exposes the source electrode 67 or the source electrode 66 may be determined based on types of the drain and source.

Step 11), successively forming a first conductive layer, a second dielectric layer and a second conductive layer on the patterned passivation layer and the opening. The first and second conductive layers may include a material with a luminousness less than 50%. The first and second conductive layers may include Au, Ag, Cu, Al, Ti, Cr, Mo, Cd, Ni, Co, poly-silicon, amorphous silicon, amorphous silicon germanium, poly-silicon germanium, or a combination thereof. The first and second conductive layers may be formed using vapor deposition. The second dielectric layer may include silicon oxide, silicon nitride, silicon carbide, silicon oxynitride, or a combination thereof, and may be formed using CVD.

Step 12), patterning the first conductive layer, the second dielectric layer and the second conductive layer to form a first plate, a capacitor dielectric layer and a second plate. The first conductive layer is patterned to form the first plate. The second conductive layer is patterned to form the second plate. The second dielectric layer is patterned to form the capacitor dielectric layer.

After the formation of the LTPS-TFT switch, a MEMS light valve, a bayonet, a cap layer and a sealing cap may be formed using the method described above.

Although the present disclosure has been disclosed as above with reference to preferred embodiments thereof but will not be limited thereto. Those skilled in the art can modify and vary the embodiments without departing from the spirit and scope of the present disclosure. Accordingly, without departing from the scope of the present invented technology scheme, whatever simple modification and equivalent variation belong to the protection range of the present invented technology scheme.

What is claimed is:

1. A display device with a micro-electromechanical system (MEMS) light valve, comprising:
    a substrate, on which a bayonet is formed; and
    a fixed optical grating and a MEMS light valve above the substrate, wherein the MEMS light valve is used to control the fixed optical grating to open or close,
    wherein the MEMS light valve comprises:
        a movable optical grating movably held by the bayonet, wherein the movable optical grating is electrically coupled to the bayonet when in contact with the bayonet, and wherein the bayonet is arranged along a predetermined traversing path of the movable optical grating, such that movement of the movable optical grating is limited by the bayonet to be in accordance with the predetermined traversing path; and
        at least one movable electrode and at least one fixed electrode, wherein the at least one movable electrode comprises one end fixed to and electrically connected with the movable optical grating and another end suspended, the at least one fixed electrode is disposed on one side or two sides of the movable electrode and constitute a capacitor with the at least one movable electrode, the movable electrode is configured to be controlled to drive the movable optical grating to move along the predetermined traversing path defined by the bayonet by controlling an electrical potential difference between the at least one fixed electrode and the movable electrode, such that the fixed optical grating is configured to be opened or closed.

2. The display device according to claim 1, wherein the fixed optical grating has a rectangle shape with a top side, a bottom side and two lateral sides;
    wherein the movable optical grating has a rectangle shape with a first side, a second side, a third side and a fourth side, the first side is opposite to the third side, the second side is opposite to the fourth side, the first side is corresponding to the top side of the fixed optical grating, the third side is corresponding to the bottom side of the fixed optical grating, and the second side and the fourth side are respectively corresponding to the two lateral sides of the fixed optical grating; and
    wherein the bayonet has a bottom fixedly mounted on the substrate, the bayonet is disposed on the first side and the third side of the movable optical grating, the first side and the third side of the movable optical grating are disposed in the bayonet, and the movable optical grating is configured to be move in the bayonet along the first side and the third side.

3. The display device according to claim 2, wherein the movable optical grating comprises a plurality of strip-shaped nonopaque openings, and the fixed optical grating comprises a plurality of strip-shaped nonopaque openings, wherein the strip-shaped nonopaque openings of the movable optical grating and the fixed optical grating are parallel with the second side, the strip-shaped nonopaque openings of the movable optical grating have a width greater than that of the strip-shaped nonopaque openings of the fixed optical grating, and an opaque part between each pair of neighboring nonopaque openings of the movable optical grating has a width greater than that of the strip-shaped nonopaque openings of the fixed optical grating.

4. The display device according to claim 2, wherein the at least one fixed electrode and the at least one movable electrode are vertical with the substrate, each of which has a height to width ratio greater than about 1.5.

5. The display device according to claim 2, wherein a number of the movable electrodes is even and a number of the fixed electrodes is even, and the movable electrodes are symmetrically disposed on the second side and the fourth side.

6. The display device according to claim 1, wherein the suspended end of the at least one movable electrode is close to the at least one fixed electrode.

7. The display device according to claim 1, wherein the fixed optical grating is circular and comprises a plurality of fan-shaped nonopaque openings, and the movable optical grating is circular and comprises a plurality of fan-shaped nonopaque openings;
    wherein the bayonet has a bottom fixedly mounted on the substrate, the bayonet is disposed on a peripheral edge of the movable optical grating, so that the circular movable optical grating is able to rotate along a peripheral direction of the movable optical grating; and
    wherein the at least one movable electrode has one end fixed to and electrically connected to the peripheral edge of the movable optical grating.

8. The display device according to claim 7, wherein a number of the movable electrodes is even and a number of the fixed electrodes is even, and the movable electrodes are symmetrically disposed the peripheral edge of the movable optical grating.

9. The display device according to claim 1, wherein the fixed optical grating is fan-shaped and comprises a plurality of strip-shaped nonopaque openings, and the movable optical grating is fan-shaped and comprises a plurality of strip-shaped nonopaque openings;

wherein the bayonet has a bottom fixedly mounted on the substrate, the bayonet is disposed on two arc sides of the movable optical grating, so that the fan-shaped movable optical grating is able to rotate along the arc sides of the movable optical grating; and wherein the at least one movable electrode has one end fixed to and electrically connected to a shorter one of the arc sides of the movable optical grating.

10. The display device according to claim 1, further comprising a plurality of thin-film-transistor (TFT) switches on the substrate or the fixed optical grating, wherein the bayonet and the at least one fixed electrode are electrically coupled to the TFT switches, respectively.

11. The display device according to claim 10, wherein each of the TFT switches comprises:

a gate, a source, a drain, a conductive channel for electrically coupling the source and the drain, a gate dielectric layer between the conductive channel and the gate, a source electrode electrically coupled to the source, a drain electrode electrically coupled to the drain, and a capacitor comprising a first plate, a second plate and a capacitor dielectric layer between the first plate and the second plate, wherein the first plate and the gate are disposed in a same layer and comprise a same conductive material having a luminousness less than about 50%, wherein the second plate, the source electrode and the drain electrode are in a same layer and comprise a same conductive material having a luminousness less than about 50%, wherein the second plate is electrically coupled to the source electrode or the drain electrode, and is electrically coupled to the fixed electrode or the bayonet.

12. The display device according to claim 11, wherein the conductive channel comprises a lightly doped silicon layer, a heavily doped silicon layer is provided between the lightly doped silicon and the gate dielectric layer, wherein the heavily doped silicon layer comprises an opening which exposes the lightly doped silicon layer, and parts of the heavily doped silicon layer on two sides of the opening respectively constitute the source and the drain.

13. The display device according to claim 11, wherein the gate dielectric layer and the capacitor dielectric layer comprise a same material and are disposed in a same layer.

14. A method for forming a display device with a microelectromechanical system (MEMS) valve, comprising:

providing a substrate;

forming a fixed optical grating and a MEMS light valve according to claim 1 above the substrate, wherein the MEMS light valve is formed on the fixed optical grating after the fixed optical grating is formed on the substrate, or else, the fixed optical grating is formed on the MEMS light valve after the MEMS light valve is formed on the substrate; and forming a bayonet on the substrate for movably holing a movable optical grating of the MEMS light valve, wherein the bayonet is arranged along a predetermined traversing path of the movable optical grating, such that movement of the movale optical grating is limited by the bayonet to be in accordance with the predetermined traversing path.

15. The method according to claim 14, wherein a plurality of thin-film-transistor (TFT) switches are formed on the substrate or the fixed optical grating before the MEMS light valve is formed, wherein the fixed electrodes are electrically coupled to the TFT switches, respectively.

16. The method according to claim 15, wherein forming each one of the TFT switches comprises:

forming a first conductive layer on the substrate or the fixed optical grating, wherein the first conductive layer comprises a conductive material having a luminousness less than about 50%;

patterning the first conductive layer to form a gate and a first plate;

forming a first dielectric layer to cover the gate and the first plate, wherein a part of the first dielectric layer on the first plate constitutes a capacitor dielectric layer, and a part of the first dielectric layer on the gate constitutes a gate dielectric layer;

successively forming a lightly doped silicon layer and a heavily doped silicon layer on a part of the first dielectric layer which is on the gate, wherein the heavily doped silicon layer comprises an opening which exposes the lightly doped silicon layer, two parts of the heavily doped silicon layer on two sides of the opening constitute a source and a drain, respectively, and the lightly doped silicon layer constitutes a conductive channel;

forming a second conductive layer to cover the first dielectric layer, the lightly doped silicon layer and the heavily doped silicon layer, wherein the second conductive layer comprises a conductive material with a luminousness less than about 50%; and patterning the second conductive layer to form a source electrode electrically coupled to the source, a drain electrode electrically coupled to the drain, and a second plate, wherein the second plate, the first plate and the part of the first dielectric layer on the first plate constitute a capacitor, and the second plate is electrically coupled to the source electrode or the drain electrode.

17. The method according to claim 15, wherein the TFT switches are low temperature poly-silicon TFT (LTPS-TFT) switches each of which is formed by:

forming a silicon layer on the substrate or the fixed optical grating;

transforming the silicon layer into a polysilicon layer;

patterning the polysilicon layer to form a patterned polysilicon layer which defines regions for a source, a drain and a channel;

forming a gate dielectric layer to cover the patterned polysilicon layer;

forming a patterned passivation layer on the gate dielectric layer;

performing ion implantation to the patterned polysilicon layer with the patterned passivation layer as a mask to form the source and the drain;

removing the mask;

forming a gate on the gate dielectric layer;

forming an interlayer dielectric layer to cover the gate dielectric layer and the gate;

forming, in the gate dielectric layer and the interlayer dielectric layer, a first plug electrically coupled to the source and a second plug electrically coupled to the drain;

forming a source electrode on the first plug and a drain electrode on the second plug;

forming a patterned passivation layer on a surface constituted by the interlayer dielectric layer, the first plug and the second plug, wherein the patterned passivation layer comprises an opening which exposes the source electrode or the drain electrode;

successively forming a first conductive layer, a second dielectric layer and a second conductive layer on the patterned passivation layer and the opening, wherein each one of the first conductive layer and the second conductive layer comprises a material with a luminousness less than about 50%; and patterning the first conductive layer, the second dielectric layer and the second conductive layer to form a first plate, a capacitor dielectric layer and a second plate, wherein the first conductive layer is corresponding to the first plate, the second conductive layer is corresponding to the second plate, and the second dielectric layer is corresponding to the capacitor dielectric layer.

18. The method according to claim 16, wherein the MEMS light valve and the bayonet are formed after the TFT switches are formed, and forming the MEMS light valve and the bayonet comprises:

successively forming a patterned first sacrificial layer and a third conductive layer on the substrate or the fixed optical grating, wherein the patterned first sacrificial layer defines a position of the MEMS light valve;

successively etching the third conductive layer and the patterned first sacrificial layer to expose positions at which the TFT switches are electrically coupled to the at least one fixed electrode and the bayonet;

forming a patterned second sacrificial layer on the etched third conductive layer and the etched patterned first sacrificial layer to define a position of the bayonet;

successively forming a fourth conductive layer and a third dielectric layer to cover the patterned second sacrificial layer and the etched third conductive layer;

patterning the fourth conductive layer and the third dielectric layer to form the bayonet and the at least one fixed electrode of the MEMS light valve;

patterning the etched third conductive layer to form the movable optical grating and the at least one movable electrode of the MEMS light valve; and removing the patterned first sacrificial layer and the patterned second sacrificial layer.

19. The method according to claim 18, further comprising:

before removing the patterned first sacrificial layer and the patterned second sacrificial layer, forming a third sacrificial layer to cover the MEMS light valve, the bayonet and the patterned first sacrificial layer; and forming a cap layer on the third sacrificial layer, wherein the cap layer comprises a plurality of openings to expose the third sacrificial layer, the cap layer encompasses the MEMS light valve from lateral sides of the MEMS light valve and covers a top of the MEMS light valve.

* * * * *